(12) United States Patent
Shiba et al.

(10) Patent No.: US 7,639,541 B2
(45) Date of Patent: Dec. 29, 2009

(54) SEMICONDUCTOR DEVICE

(75) Inventors: Kazuyoshi Shiba, Tsuchiura (JP); Yasushi Oka, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 155 days.

(21) Appl. No.: 11/971,546

(22) Filed: Jan. 9, 2008

(65) Prior Publication Data
US 2008/0259682 A1 Oct. 23, 2008

Related U.S. Application Data

(63) Continuation of application No. 11/329,087, filed on Jan. 11, 2006, now Pat. No. 7,388,777.

(30) Foreign Application Priority Data
Jan. 14, 2005 (JP) ............................. 2005-007822

(51) Int. Cl.
*G11C 11/03* (2006.01)
(52) U.S. Cl. ........................... 365/185.18; 365/185.24; 365/185.26; 365/185.27
(58) Field of Classification Search ............ 365/185.18, 365/185.24, 185.26, 185.27
See application file for complete search history.

(56) References Cited

U.S. PATENT DOCUMENTS 5,477,068 A 12/1995 Ozawa
5,917,751 A 6/1999 Wakita
7,349,253 B2 * 3/2008 Perner et al. ........... 365/185.09
7,460,396 B2 * 12/2008 Oka et al. .............. 365/185.01

FOREIGN PATENT DOCUMENTS

JP 2001-185633 7/2001
JP 2001-257324 9/2001

* cited by examiner

*Primary Examiner*—Pho M. Luu
(74) *Attorney, Agent, or Firm*—Antonelli, Terry, Stout & Kraus, LLP.

(57) ABSTRACT

A semiconductor device includes a circuit forming area and a memory area including memory cells, first and second wells, a first conductor film formed over both wells and a second conductor film formed over the first well. First semiconductor regions are formed in the first region and a second semiconductor region is formed in the second region. The memory cells each include a capacitance element, including the first conductor film and second region, an element for reading data, including the first conductor film and first regions, and a selection field effect transistor, including the second conductor film and first regions. A length of the first conductor film of the capacitance element is larger than a length of the first conductor film of the element for reading data. A word line of the memory cell is connected to the second semiconductor region. During a reading data operation, a first bit line of the memory cell is connected to the first semiconductor region of the element for reading data via the selection field effect transistor.

14 Claims, 32 Drawing Sheets

SEMICONDUCTOR DEVICE

CROSS-REFERENCE TO RELATED APPLICATION

This application is a continuation of U.S. application Ser. No. 11/329,087, filed Jan. 11, 2006 now U.S. Pat. No. 7,388, 777, and which application claims priority from Japanese patent application No. 2005-007822 filed on Jan. 14, 2005, the contents of which are hereby incorporated by reference into this application.

BACKGROUND OF THE INVENTION

The present invention relates to semiconductor device technology, and particularly to a technique effective if applied to a semiconductor device having a nonvolatile memory.

Of semiconductor devices each having a nonvolatile memory, there is known one used to store relatively small-capacity information, like information used upon, for example, trimming, relief and image adjustments to an LCD (Liquid Crystal Device), the production number of the semiconductor device, etc.

This type of semiconductor device having the nonvolatile memory has been described in, for example, Japanese Unexamined Patent Publication No. 2001-185633 (patent document 1), which discloses a single level/poly EEPROM configured over a single conductive layer disposed over a semiconductor substrate with being insulated by an insulating layer, wherein the area per bit can be reduced.

A technique capable of causing a nonvolatile memory element formed by a single-layer poly flat technique to enhance a long-term information retention characteristic has been disclosed in, for example, Japanese Unexamined Patent Publication No. 2001-257324 (patent document 2).

SUMMARY OF THE INVENTION

Meanwhile, it has been discussed that the nonvolatile memory attached externally in general is formed in a semiconductor chip formed with principal or main circuits like, for example, an LCD driver and the like to enhance the added values of a product. However, the capacity of the nonvolatile memory also tends to increase with an improvement in the performance of each main circuit referred to above. There is a fear that the simple placement of cells of a nonvolatile memory can lead to an increase in the size of each product. Thus, the present inventors have discussed that the cells of the nonvolatile memory are disposed in array form to reduce the occupied area of the nonvolatile memory. However, the present inventors have found out the problems that, for example, when reading and writing of data from and to a desired cell in an array of the nonvolatile memory are done, unwanted erasure of data due to data disturb and an inability to write data due to a non-selection leak occur in each non-selected cell in the array or misreading of information occurs due to the turning on of the non-selected cell upon data reading, thus making it impossible to simply dispose the cells of the nonvolatile memory in array form.

An object of the present invention is to provide a technique capable of disposing cells of a small-capacity nonvolatile memory in array form in a semiconductor chip formed with main circuits.

The above, other objects and novel features of the present invention will become apparent from the description of the present specification and the accompanying drawings.

A summary of a representative one of the inventions disclosed in the present application will briefly be explained as follows:

The present invention provides a semiconductor device wherein a plurality of cells of a nonvolatile memory are disposed in array form in a semiconductor chip formed with main circuits, and cell selection elements are respectively electrically connected to the plurality of nonvolatile memory cells.

Advantageous effects obtained by the representative one of the inventions disclosed in the present application will briefly be explained as follows:

Cells of a small-capacity nonvolatile memory can be disposed in array form in a semiconductor chip formed with main circuits, and the occupied area of the nonvolatile memory can be reduced. Therefore, the added values of a semiconductor device can be enhanced without incurring an increase in the size of the semiconductor chip formed with the main circuits.

The present invention can be applied to industries for a semiconductor device and an electronic apparatus.

DETAILED DESCRIPTION OF THE PREFERRED EMBODIMENTS

Figure 1:
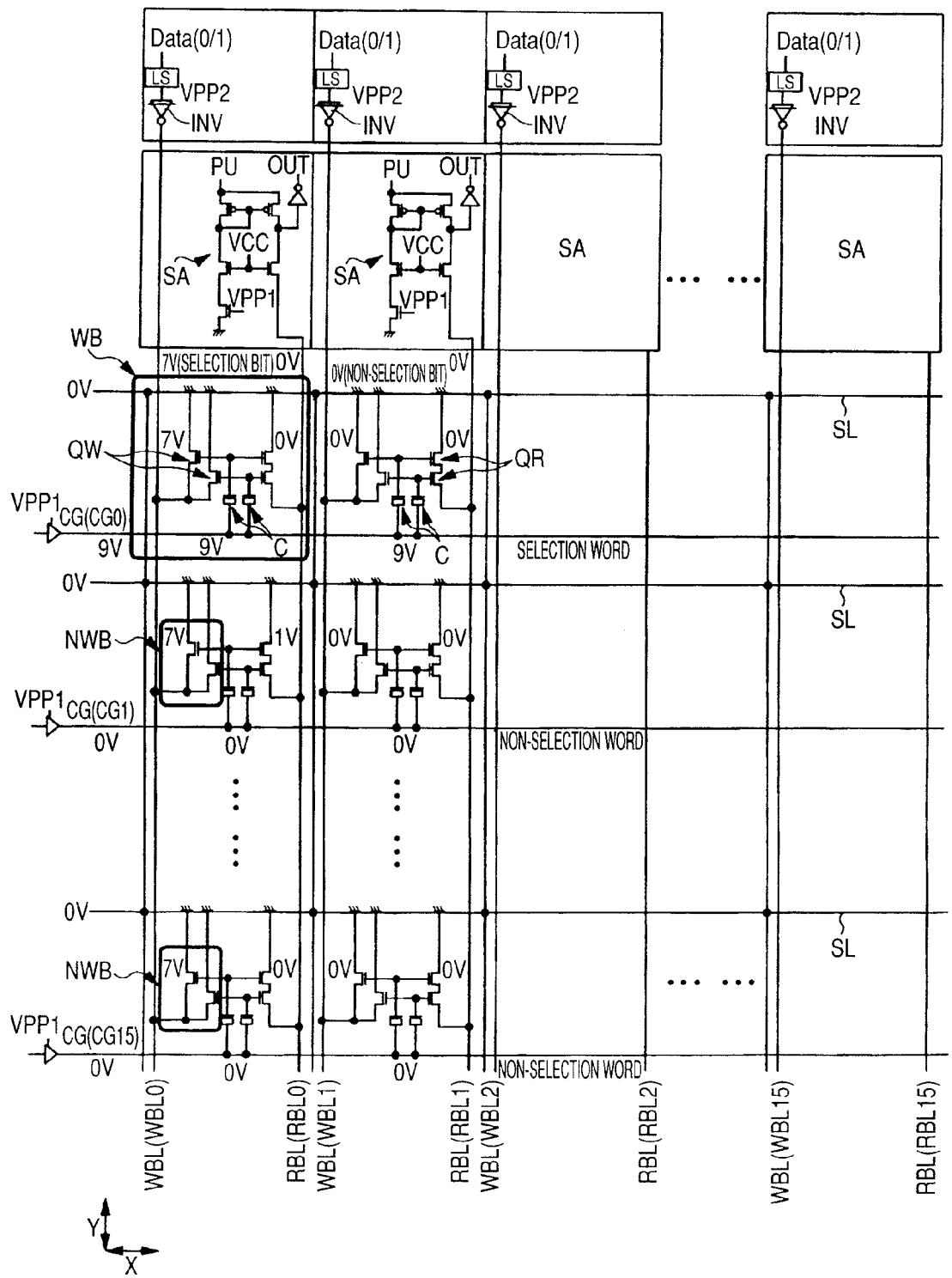
FIG. 1 is a circuit diagram of a nonvolatile memory discussed by the present inventors.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle. It is also needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range. Constituent elements each having the same function in all the drawings for describing the present embodiments are respectively given the same reference numerals, and their repetitive explanations will therefore be omitted where possible. Preferred embodiments of the present invention will hereinafter be described in detail with reference to the accompanying drawings.

First Preferred Embodiment

A semiconductor device according to a first embodiment is one wherein a semiconductor chip formed with various main circuits such as memory circuits like, for example, a DRAM (Dynamic Random Access Memory), an SRAM (Static RAM) and like, logic circuits like a CPU (Central Processing Unit), an MPU (Micro Processing Unit) and the like, a mixed circuit of these memory circuits and logic circuits or an LCD (Liquid Crystal Device) driver circuit, etc. is formed with a nonvolatile memory which stores desired information of relatively small capacitances of the main circuits. As the desired information, may be mentioned, for example, addresses at which effective (used) elements used upon trimming in the semiconductor chip are placed, addresses at which effective memory cells (defect-free memory cells) or effective LCD elements are disposed for the relief of a memory or an LCD, trimming tap information about adjustment voltages used upon control on LCD images or a production number of the semiconductor device, etc.

Prior to the description of the semiconductor device according to the first embodiment, the configuration of the nonvolatile memory discussed by the present inventors, and problems at data writing of the nonvolatile memory will first be explained with reference to FIGS. 1 through 7.

FIG. 1 shows a circuit diagram of the nonvolatile memory discussed by the present inventors upon forming the main circuits and the nonvolatile memory in the same semiconductor chip. Incidentally, symbol Y indicates a first direction (gate-width direction of nonvolatile memory cell), and symbol X indicates a second direction (gate-length direction of nonvolatile memory cell) orthogonal to the first direction Y, respectively.

The nonvolatile memory is of, for example, a read-only EPROM (Erasable Programmable Read Only Memory), i.e., a so-called OTPROM (One Time Programmable ROM) free of execution of erasure after once writing of data. The nonvolatile memory has a memory cell array and peripheral circuit areas. A plurality of data writing bit lines WBL (WBL0 through WBL15) and data reading bit lines RBL (RBL0 through RBL15) extending in the first direction Y are alternately disposed in the memory cell array along the second direction X. Further, a plurality of control gate wirings (word lines) CG (CG0 through CG15) and source lines SL extending in the second direction X orthogonal to these bit lines WBL and RBL are alternately disposed in the memory cell array along the first direction. The data writing bit lines WBL are electrically connected to their corresponding inverter circuits INV for the input of data (0/1) disposed in the corresponding peripheral circuit area. The data reading bit lines RBL are electrically connected to their corresponding sense amplifier circuits SA disposed in the corresponding peripheral circuit area. Each of the sense amplifier circuits SA is configured as, for example, a current mirror type. Nonvolatile memory cells (hereinafter called simply "memory cells") corresponding to one bit are electrically connected to the neighborhood of each of lattice-like intersecting points of the bit lines WBL and RBL and the control gate wirings CG and source lines SL. A case in which one bit is constituted of two memory cells is illustrated by way of example in the present embodiment.

Each of the memory cells has a MIS-FET (Metal Insulator Semiconductor Field Effect Transistor) QW for writing data, a MIS-FET QR for reading data and a capacitance section C. The MIS-FETs QW for writing data of the two memory cells corresponding to each bit are electrically connected so as to be parallel with each other. That is, the respective drains of the MIS-FETs QW for writing data of the two memory cells are electrically connected to the corresponding data writing bit line WBL, the respective sources thereof are electrically connected to the corresponding source line SL, and their gate electrodes are electrically connected to the corresponding control gate wiring CG via the discrete capacitance sections C and C. On the other hand, the MIS-FETs QR for reading data of the two memory cells corresponding to each bit are electrically connected so as to be in series with each other. The drains of the MIS-FETs QR for reading data are electrically connected to the corresponding data reading bit line RBL, the sources thereof are electrically connected to the corresponding source line SL, and their gate electrodes are electrically connected to the corresponding control gate wiring CG via discrete capacitor sections C and C.

Figure 2:
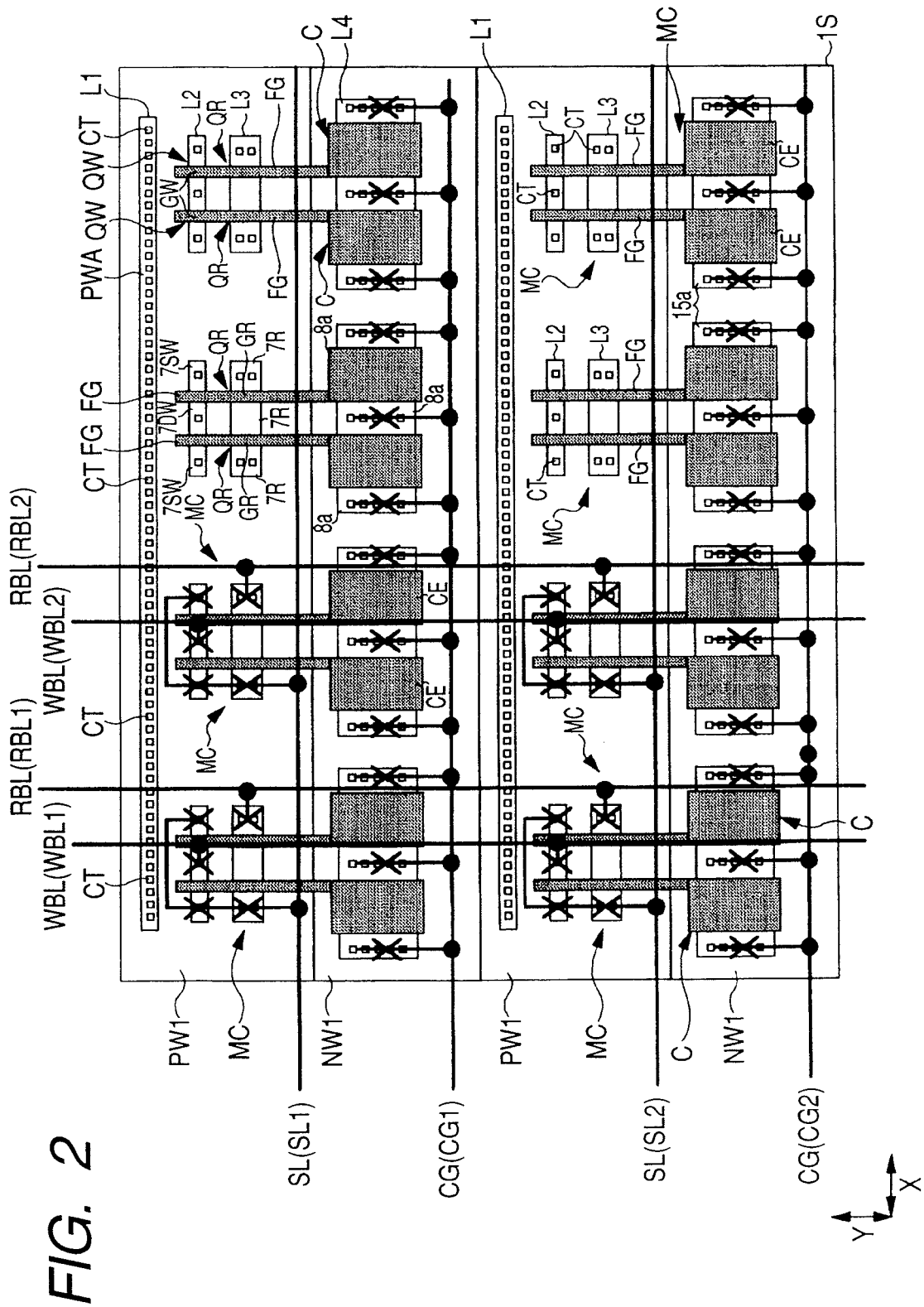
FIG. 2 is a fragmentary plan view of a memory cell array of the nonvolatile memory shown in FIG. 1.
Figure 3:
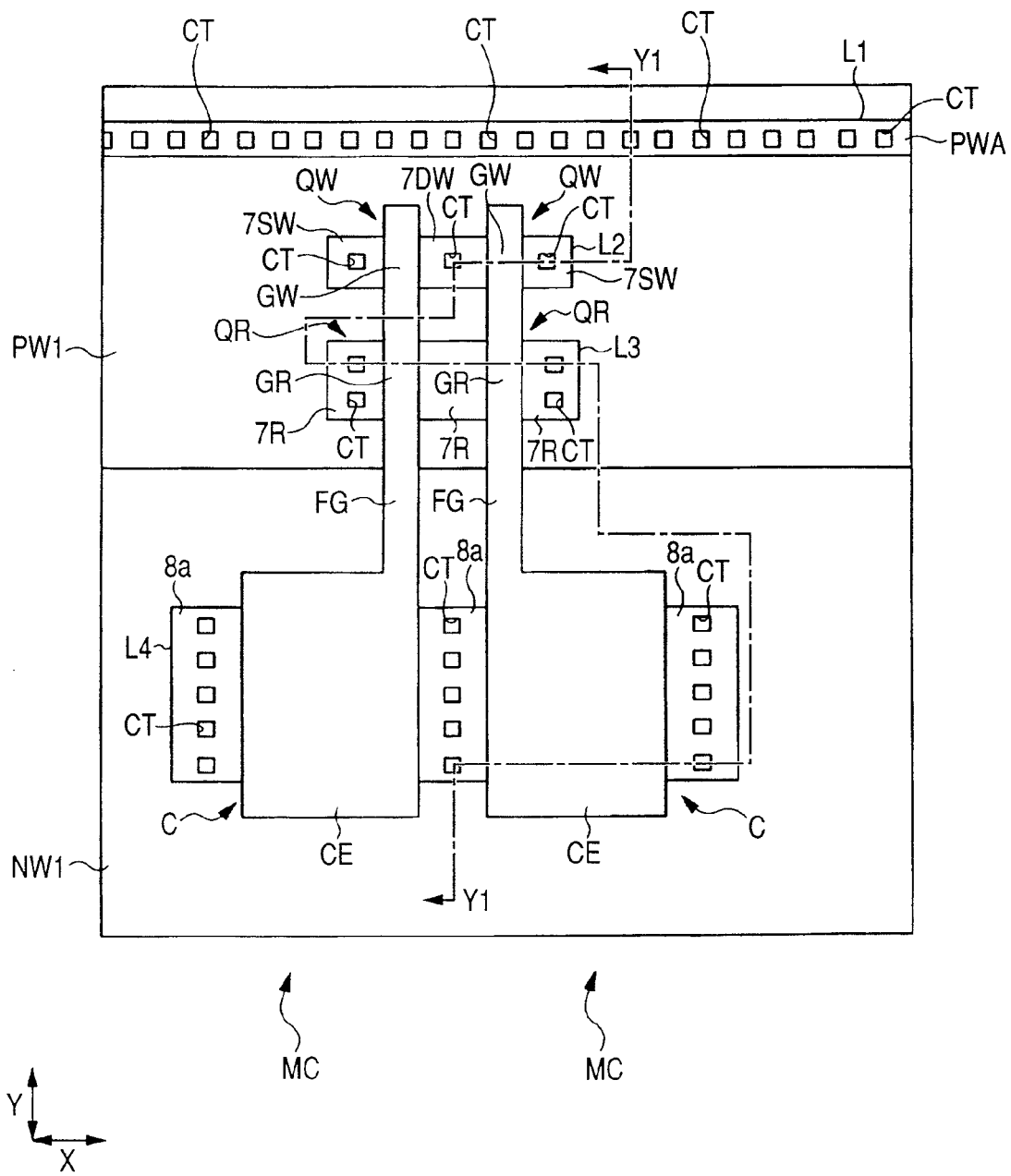
FIG. 3 is an enlarged plan view showing a section corresponding to one bit, of the memory cell array of the nonvolatile memory shown in FIG. 2.
Figure 4:
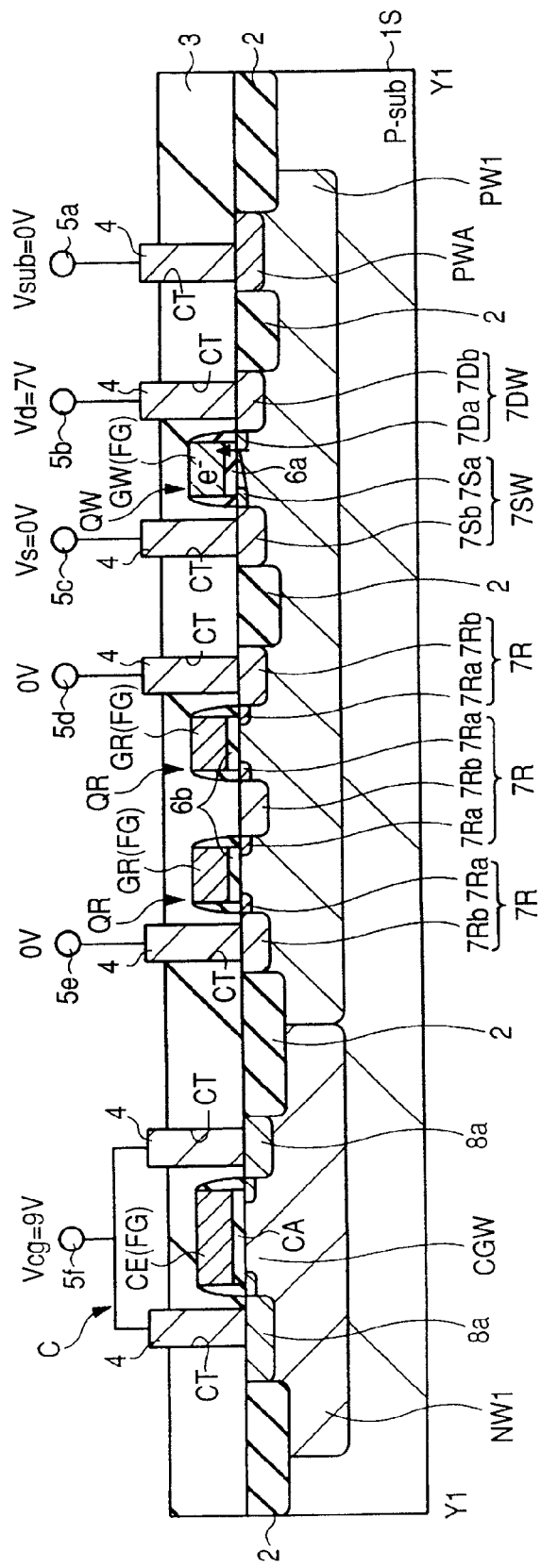
FIG. 4 is a cross-sectional view taken along line Y1-Y1 of FIG. 3, of a selected memory cell at data writing.
Figure 5:
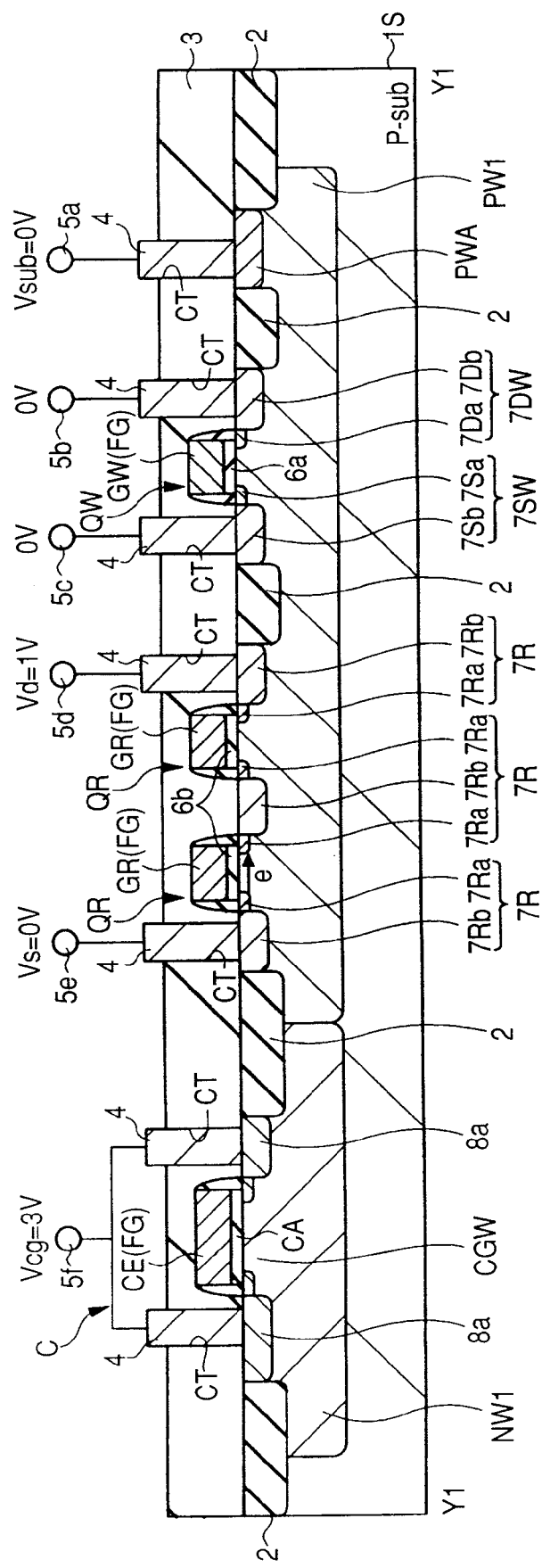
FIG. 5 is a cross-sectional view taken along line Y1-Y1 of FIG. 3, of the selected memory cell at data reading.

Next, FIG. 2 shows a fragmentary plan view of the memory cell array of the nonvolatile memory shown in FIG. 1, FIG. 3 shows an enlarged plan view showing a section corresponding to one bit, of the memory cell array of the nonvolatile memory shown in FIG. 2, FIG. 4 shows a sectional view taken along line Y1-Y1 of FIG. 3, of a selected memory cell at data writing, and FIG. 5 shows a cross-sectional view taken along line Y1-Y1 of FIG. 3, of the selected memory cell at data reading, respectively.

A semiconductor substrate (hereinafter called simply "substrate") 1S that constitutes the semiconductor chip is constituted of, for example, a p-type silicon (Si) monocrystal. A plurality of the memory cells MCs having, for example, a 8×2-bit configuration are disposed side by side on a regular basis in array form (matrix form) in the memory cell array placed over a main surface (first main surface) of the substrate 1S.

In the main surface of the substrate 1S, p wells (first well, p type semiconductor region) PW1 and n wells (second well, n type semiconductor region) NW1 extending in band form in the second direction X are alternately adjacent to one another along the first direction Y and disposed in electrically-separated states. The plurality of memory cells MCs are respectively disposed so as to be superimposed on both of the p wells PW1 and n wells NW1 on a plane basis. Incidentally, an impurity indicative of a p type (first conduction type) is introduced into each p well PW1 and contains, for example, boron (B). An impurity indicative of an n type (second conduction type) is introduced into each n well NW1 and contains, for example, phosphorus (P).

Separation sections 2 that define active regions L1 through L4 are disposed in the main surface of the substrate 1S. The separation sections 2 are, for example, trench-type separation sections called so-called SGI (Shallow Groove Isolation) or STI (Shallow Trench Isolation) formed by embedding an insulating film formed of a silicon oxide film or the like in shallow grooves dug in the main surface of the substrate 1S. Each active region L1 is disposed in the p well PW1 in a state of extending along the direction in which the p well PW1 extends. The active region L1 is formed with a $p^+$ type semiconductor area PWA for well power feeding. The $p^+$ type semiconductor area PWA is electrically connected to well power-feeding electrodes 5a through conductive parts or sections 4 in a plurality of contact holes CT defined in an insulating layer 3. For example, boron is contained in the $p^+$ type semiconductor area PWA in high concentration. The electrode 5a is formed of, for example, a metal like aluminum or the like.

Each of the memory cells MCs has a floating gate electrode FG, the MIS-FET QW for writing data, the MIS-FET QR for reading data and the capacitance section C.

The floating gate electrode FG is a part which stores therein an electrical charge that contributes to the storage of information. The floating gate electrode FG is formed of a conductive film and comprises, for example, low-resistance polycrystalline silicon. The floating gage electrode FG is formed in an electrically floating state (state of being insulated from other conductor) and in a state of extending along the first direction Y so as to be superimposed, on a plane basis, over both of the p well PW1 and n well NW1 adjacent to each other.

The MIS-FET QW for writing data is placed in a first position where the floating gate electrode FG is superimposed over the active region L2 of the p well PW1 on a plane basis. The MIS-FET QW for writing data has a gate electrode (first gate electrode) GW formed by part of the floating gate electrode FG at the first position, a gate insulating film (first gate insulating film) 6a formed between the gate electrode GW and the substrate 1S (p well PW1), and a pair of n type semiconductor areas 7SW and 7DW for the source and drain formed at a position where the gate electrode GW is interposed therebetween within the p well PW1, i.e., a position where they match with the gate electrode GW. A channel of the MIS-FET QW for writing data is formed in a layer above the p well PW1 at which the gate electrode GW and the active region L2 overlap on a plane basis. The gate insulating film 6a is formed of, for example, silicon oxide.

The pair of semiconductor areas 7SW and 7DW for the source and drain respectively have $n^-$ type semiconductor areas 7Sa and 7Da on the channel side and $n^+$ type semiconductor areas 7Sb and 7Db respectively connected thereto. For example, phosphorus or arsenic (As) is contained in the $n^-$ type semiconductor areas 7Sa and 7Da and the $n^+$ type semiconductor areas 7Sb and 7Db. The $n^+$ type semiconductor areas 7Sb and 7Db are respectively regions relatively higher in impurity concentration than the $n^-$ type semiconductor areas 7Sa and 7Da.

The semiconductor area 7DW for the respective MIS-FETs QW for writing data of the two memory cells MCs corresponding to one bit is used in common in the present embodiment. The semiconductor area 7DW is electrically connected to a drain electrode 5b through the conductive section 4 in the corresponding contact hole CT and electrically connected to each of the data writing bit lines WBL (WBL1, WBL2). The semiconductor area 7SW of the MIS-FET QW for writing data is electrically connected to a source electrode 5c through the conductive section 4 in the corresponding contact hole CT and electrically connected to each of the source lines SL (SL1, SL2). The electrodes 5b and 5c and the data writing bit lines WBL and source lines SL are respectively formed of, for example, a metal like aluminum or the like.

The MIS-FET QR for reading data is placed in a second position where the floating gate electrode FG is superimposed over the active region L3 of the p well PW1 on a plane basis. The MIS-FET QR for reading data has a gate electrode (second gate electrode) GR formed by part of the floating gate electrode FG at the second position, a gate insulating film (second gate insulating film) 6b formed between the gate electrode GR and the substrate 1S (p well PW1), and a pair of n type semiconductor areas 7R and 7R formed at a position where the gate electrode GR is interposed therebetween within the p well PW1, i.e., a position where they match with the gate electrode GR. A channel of the MIS-FET QR for reading data is formed in a layer above the p well PW1 at which the gate electrode GR and the active region L3 overlap on a plane basis. The gate insulating film 6b is formed of, for example, silicon oxide. The pair of semiconductor areas 7R and 7R respectively have $n^-$ type semiconductor areas 7Ra and 7Ra on the channel side and $n^+$ type semiconductor areas 7Rb and 7Rb respectively connected thereto. For example, phosphorus or arsenic is contained in the $n^-$ type semiconductor areas 7Ra and the $n^+$ type semiconductor areas 7Rb. The $n^+$ type semiconductor area 7Rb is a region or area relatively higher in impurity concentration than the $n^-$ type semiconductor area 7Ra.

Here, one semiconductor area 7R of one of the respective MIS-FETs QR for reading data of the two memory cells MCs corresponding to one bit is used in common so as to function as a diffusion layer wiring for electrically connecting the respective MIS-FETs QR. The other semiconductor area 7R (on the unsharing side) of the MIS-FET QR of one of the two memory cells MCs is electrically connected to an electrode 5d through a conductive section 4 in each contact hole CT and electrically connected to its corresponding data reading bit line RBL (RBL1, RBL2). The other semiconductor area 7R (on the unsharing side) of the MIS-FET QR of the other of the two memory cells MCs is electrically connected to an electrode 5e through a conductive section 4 in each contact hole CT and electrically connected to its corresponding source line SL (SL1, SL2). The electrodes 5d and 5e and the data reading bit lines RBL are respectively formed of, for example, a metal like aluminum or the like.

The capacitance section C is formed at a position where the floating gate electrode F is superimposed over the n well NW1 on a plane basis. The capacitance section C has a control gate electrode CGW, a capacitance electrode CE and a capacitance insulating film CA formed between the control gate electrode CGW and the capacitance electrode CE. The control gate electrode CGW is formed at a part to which the floating gate electrode FG is opposite in the n well NW1. The floating gate electrode FG is formed in the same layer as a gate electrode of each element of a main circuit formed over the main surface of the substrate 1S. That is, the control gate electrode CGW is formed by the n well NW1 and a polycrystal silicon layer formed over the main surface of the substrate 1S is provided as one layer of the floating gate electrode FG to thereby make it possible to facilitate manufacturing matching with other elements of the main circuit in the same substrate 1S. It is therefore possible to shorten the time required to fabricate the semiconductor device and achieve a reduction in its manufacturing cost. The n well NW1 is electrically connected to its corresponding conductive sections 4 in the contact holes CTs through $n^+$ type semiconductor areas 8a placed in positions on both the right and left sides of the capacitance electrodes CEs as viewed in the plane and formed in an upper layer portion of the n well NW1 as viewed in section. The n well NW1 is electrically connected to its corresponding electrode 5f through the conductive sections 4 and electrically connected to the control gate wiring CG (CG1, CG2). The electrode 5f and the control gate wiring CG are formed of, for example, a metal like aluminum or the like. The $n^+$ type semiconductor area 8a is formed at a position where it matches with the gate electrode FG and contains, for example, phosphorus or arsenic.

The capacitance electrode CE of each capacitance section C is formed by part of the floating gate electrode FG opposite to the control gate electrode CGW. A portion of the capacitance electrode CE of the floating gate electrode FG is formed in such a manner that the length thereof in the second direction X becomes longer than the lengths in the second direction X, of the gate electrode GW of the MIS-FET QW for writing data of the floating gate electrode FG and the gate electrode GR of the MIS-FET QR for reading data. The portion thereof is formed as a pattern having a relatively large area. Thus, it is possible to enhance a coupling ratio and improve the efficiency of supply of the voltage from control gate wiring CG. The capacitance insulating film CA is formed of, for example, silicon oxide. The gate insulating films 6a and 6b and the capacitance insulating film CA are formed in the same thermal oxidation process, and their thicknesses are about 13.5 nm, for example. Also the gate insulating films 6a and 6b and the capacitance insulating film CA are formed in the same process as the gate insulating film of each main circuit formed over the main surface of the substrate 1S. In order to enhance reliability of the nonvolatile memory in particular, they are formed in the same process as a gate insulating film of a high breakdown MIS-FET relatively thick in gate insulating film, of both the high breakdown MISFET and a low voltage MIS-FET relatively thin in gate insulating film.

A data write operation of such a nonvolatile memory will next be explained with reference to FIGS. 1 and 4. When data writing is done in each memory cell MC (selected memory cell) intended for the data writing, for example, a control voltage (positive first voltage) Vcg=9V is applied from the corresponding control gate wiring CG to the n well NW1 forming the control gate electrode CGW through the electrode 5f, for example, a substrate voltage Vsub=0V is applied to the p well PW1 through the electrode 5a, for example, a voltage (positive second voltage) Vd=7V lower than the control voltage is applied from the corresponding data writing bit line WBL to the drain semiconductor area 7DW of the MIS-FET QW for writing data through the electrode 5b, for example, a reference voltage Vs=0V is applied from the corresponding source line SL to the source semiconductor area 7SW of the MIS-FET QW for writing data through the electrode 5c, and, for example, 0V (or defined as an open-circuit potential) is applied to the pair of semiconductor areas 7R and 7R for the source and drain, of the MIS-FETs QR for reading data through the electrodes 5d and 5e. Thus, channel hot electrons ($e^-$) are implanted into the gate electrodes GW (floating gate electrodes FG) in the MIS-FETs QW and QW for writing data, so that the writing of data is performed.

A data read operation of such a nonvolatile memory will next be described with reference to FIG. 5. When data reading is done in each memory cell MC (selected memory cell) intended for the data reading, for example, a control voltage Vcg=3V is applied from the corresponding control gate wiring CG to the n well NW1 forming the control gate electrode CGW through the electrode 5f, for example, a substrate voltage Vsub=0V is applied to the p well PW1 through the electrode 5a, for example, a voltage Vd=1V is applied to one of the pair of semiconductor areas 7R for the source and drain, of the MIS-FETs QR for reading data through the electrode 5d, for example, a reference voltage Vs=0V is applied to the other of the pair of semiconductor areas 7R of the MIS-FETs QR for reading data through the electrode 5e, and, for example, 0V (or defined as an open-circuit potential) is applied to the semiconductor areas 7SW and 7DW for the source and drain, of the MIS-FETs QW for writing data through the electrodes 5b and 5c. Thus, the MIS-FET QR for reading data of the selected memory cell MC is set as an On condition, and either 0 or 1 is read as data stored in the selected memory cell MC according to whether a drain current flows through the channel of the MIS-FET QR for reading data.

Meanwhile, when the memory cells MCs are disposed in array form as described above, the above nonvolatile memory (OTPROM) causes the following problems upon its data write operation. It has been found out for the first time by the present inventors that the cells of the nonvolatile memory cannot simply be laid out in array form. This will be explained with reference to FIGS. 1, 6 and 7. Incidentally, symbol WB shown in FIG. 1 indicates a write bit intended for writing, and symbol NWB indicates a non-write bit intended for non-writing.

Figure 6:
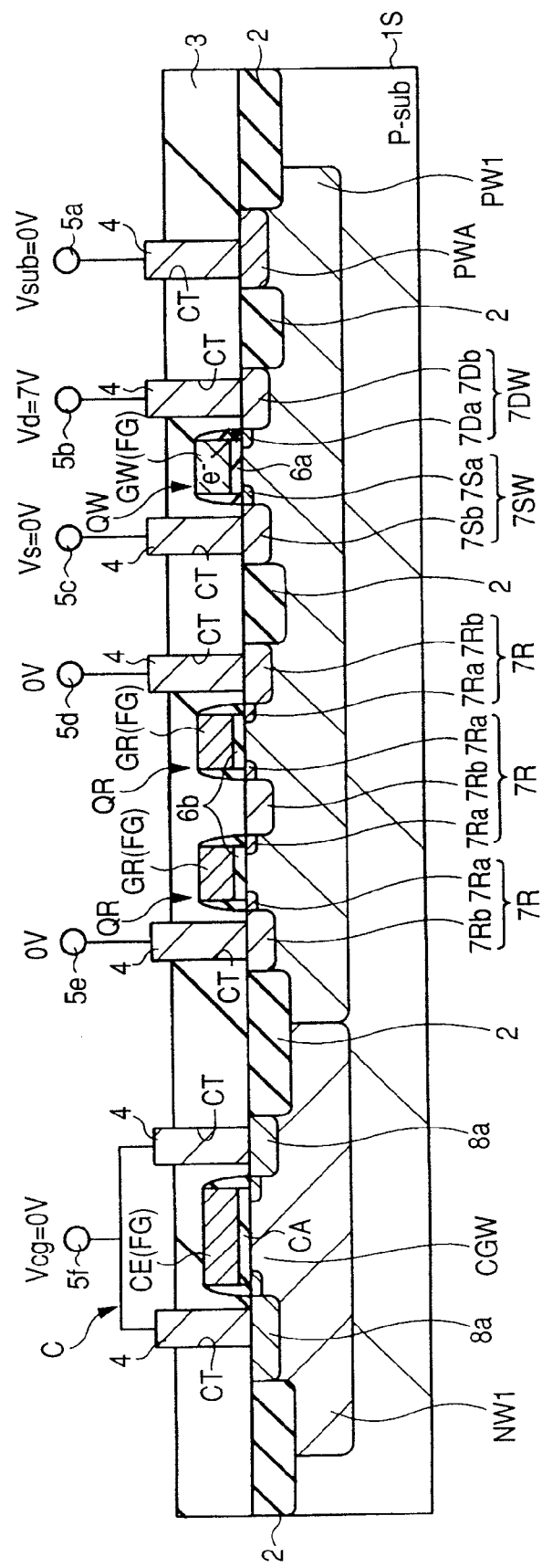
FIG. 6 is a cross-sectional view taken along line Y1-Y1 of FIG. 3, of a non-selected memory cell at data writing.

The first problem is a problem that when the threshold voltage of the MIS-FET QW for writing data of each non-selected memory cell MC is high, data stored in the non-selected memory cell MC will disappear despite the intention due to a data disturb phenomenon. FIG. 6 is a sectional view taken along line Y1-Y1 of FIG. 3, of the non-selected memory cell MC at the data writing and shows a problem that arises where the threshold voltage of the MIS-FET QW for writing data of the non-selected memory cell MC is high. Although the voltage applied to the control gate electrode CGW of the non-selected memory cell MC is 0v upon data writing as shown in FIG. 1, a voltage of 7V is applied even to the drain semiconductor area 7DW of the MIS-FET QW for writing data of the non-selected memory cell MC through the corresponding data writing bit line WBL. Therefore, the electrical charge for information stored in the floating gate electrode FG is discharged from the gate electrode GE of the MIS-FET QW for writing data of the non-selected memory cell MC to the drain semiconductor area 7DW side in the form of an FN tunnel current, so that data is cleared despite the intention (data disturb). Since the configuration of the memory cell MC having the capacitance section C as described above is high in coupling ratio in particular, the electrical charge is easy to be discharged in the case of only a little amount of voltage. Hence, it results in a configuration weak to the data disturb phenomenon.

Figure 7:
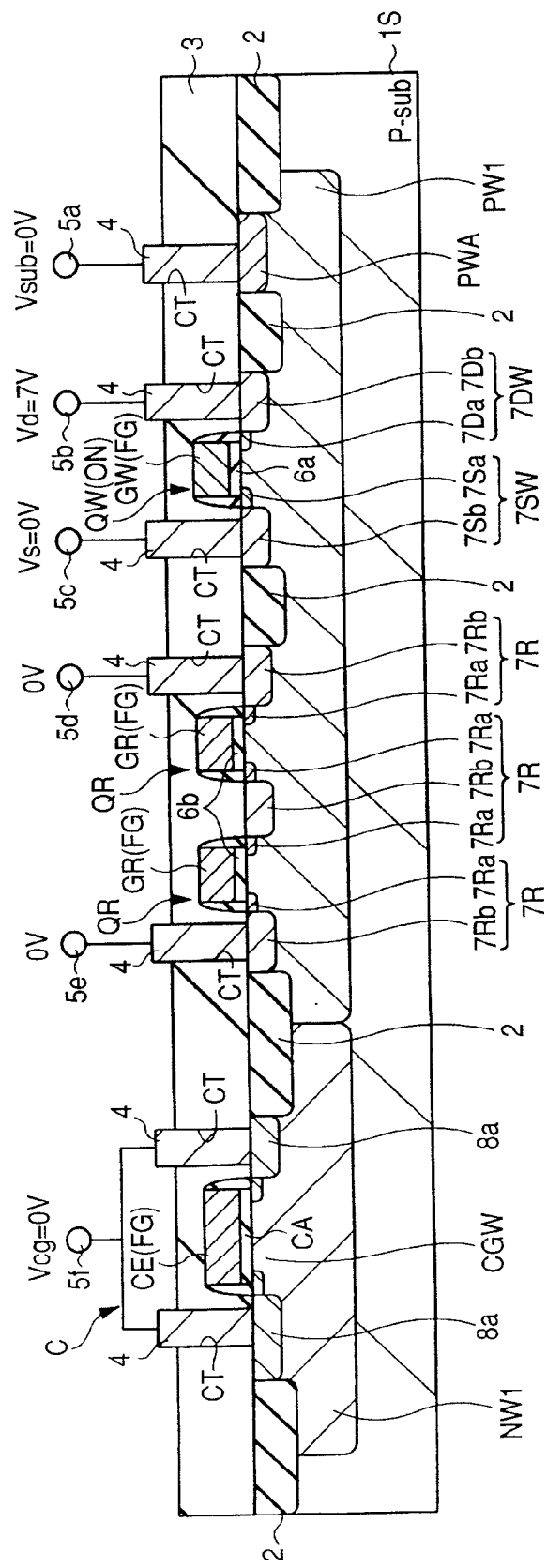
FIG. 7 is a cross-sectional view taken along line Y1-Y1 of FIG. 3, of the non-selected memory cell at the data writing.

The second problem is a problem that when the threshold voltage of the MIS-FET QW for writing data of each non-selected memory cell MC is low, the potential on the corresponding data writing bit line WBL is lowered due to a non-selection leak, so that data cannot be written into the memory cell MC intended for selection. FIG. 7 is a sectional view taken along line Y1-Y1 of FIG. 3, of the non-selected memory cell MC at the data writing and shows a problem that arises where the threshold voltage of the MIS-FET QW for writing data of the non-selected memory cell MC is low. Although the voltage applied to the control gate electrode CGW of the non-selected memory cell MC is 0V in this case, the threshold voltage of the MIS-FET QW for writing data is low. Therefore, when a voltage of 7V is applied to the drain semiconductor area 7DW of the MIS-FET QW for writing data, the MIS-FET QW for writing data is turned on, so a current flows between its drain and source (non-selection leak). As a result, the potential of the data writing bit line WBL is lowered so that the voltage required for writing cannot be maintained, whereby sufficient writing is not effected on the selected memory cell MC.

Figure 8:
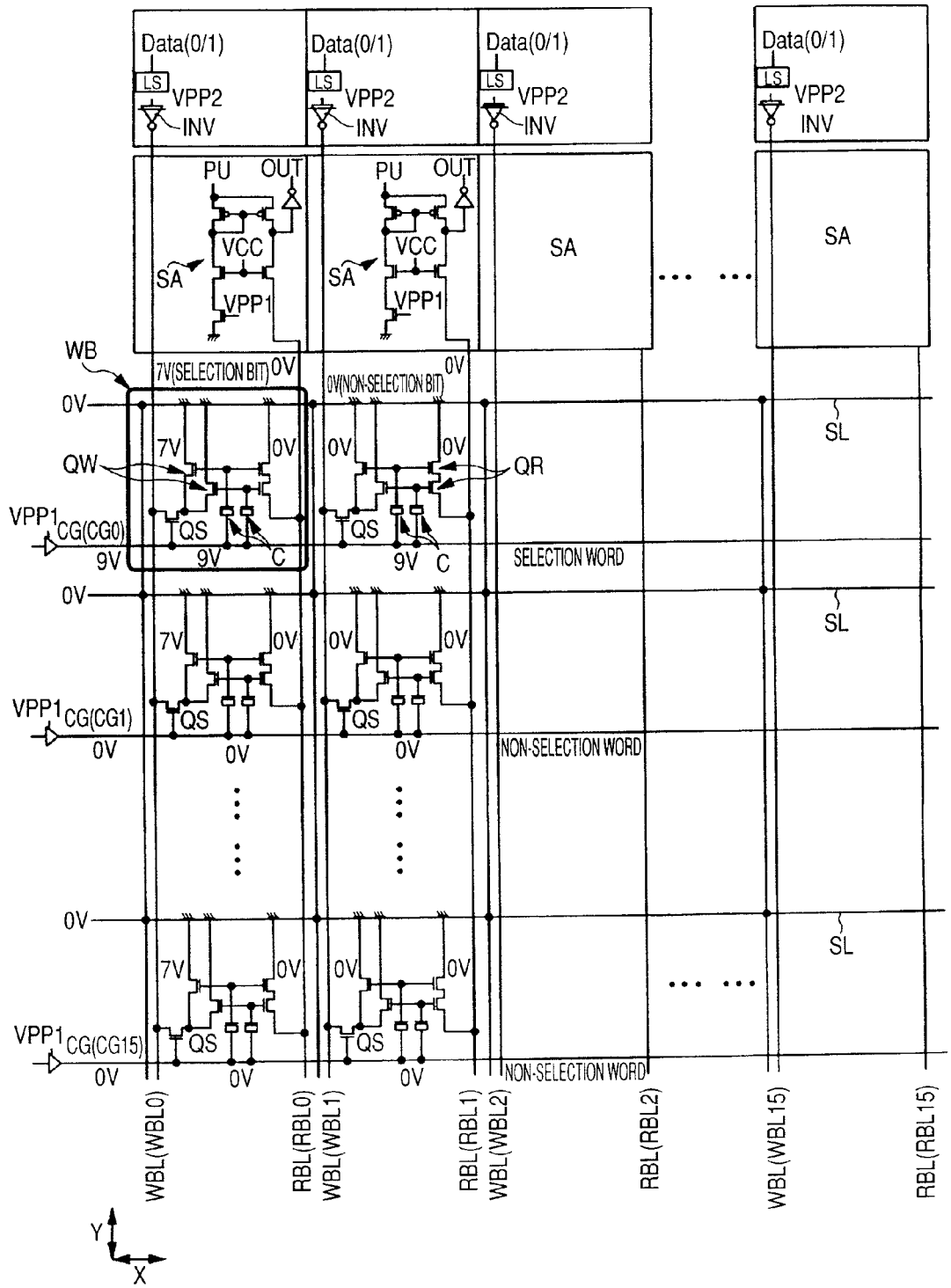
FIG. 8 is a circuit diagram showing one example illustrative of applied voltages at data writing of a nonvolatile memory of a semiconductor device according to a first embodiment of the present invention.

Thus, in the first embodiment, selection MIS-FETs QS are electrically connected to their corresponding MIS-FETs QW for writing data of a plurality of memory cells MCs, and a write voltage is set so as not to be applied to the drain of each of the MIS-FETs QW for writing data of the non-selected memory cells MCs. FIG. 8 is one example of a circuit diagram of a nonvolatile memory according to the first embodiment and shows one example illustrative of applied voltages at data writing. Conditions for the voltages applied to respective portions of each selected memory cell MC upon the data writing are the same as those described in FIGS. 1 and 4.

In the first embodiment, each selection MIS-FET QS is electrically connected between the drain of the MIS-FET QW for writing data and its corresponding data writing bit line WBL with respect to each bit of the nonvolatile memory. That is, the gate electrode of the selection MIS-FET QS is electrically connected to its corresponding control gate wiring CG. One of the source and drain of each selection MIS-FET QS is electrically connected to its corresponding data writing bit line WBL, whereas the other thereof is electrically connected to its corresponding drain of the MIS-FET QW for writing data.

In this case, a voltage of 9V is applied to the gate electrode of the selection MIS-FET QS through the control gate wiring CG upon the data write operation in the memory cell MC intended for selection. Therefore, the selection MIS-FET QS is turned on so that a voltage of 7V is applied to the corresponding semiconductor area 7DW for drain, of the MIS-FET QW for writing data of the memory cell MC through the selection MIS-FET QS, whereby satisfactory data writing is done. On the other hand, a voltage of 0V is applied to a gate electrode of a selection MIS-FET QS through a control gate wiring CG in each non-selected memory cell MC electrically connected to its corresponding data writing bit line WBL intended for selection. Therefore, the selection MIS-FET QS is not turned on, so that the voltage of 7V is not applied to a semiconductor area 7DW for drain, of a MIS-FET QW for writing data of the non-selected memory cell MC. It is therefore possible to avoid the problems about the data disturb and non-selection leak produced in each non-selected memory cell MC upon the data writing. Accordingly, the memory cells of the small-capacity nonvolatile memory (OTPROM) can be disposed in array form in the semiconductor chip formed with the main circuits, and the occupied area of the nonvolatile memory can be reduced. Therefore, the added values of the semiconductor device can be enhanced without incurring an increase in the size of the semiconductor chip formed with the main circuits.

Figure 9:
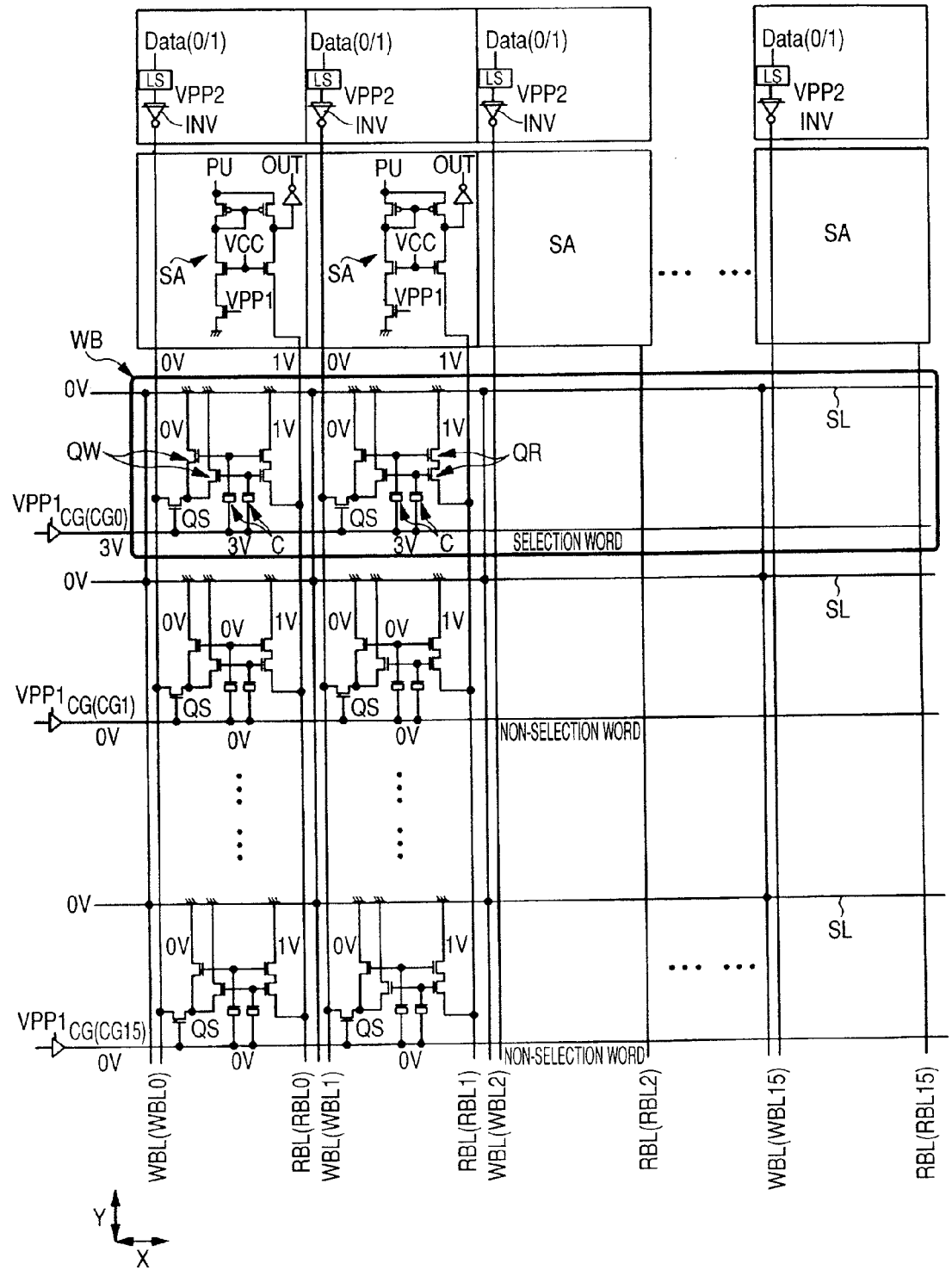
FIG. 9 is a circuit diagram showing one example illustrative of applied voltages at data reading of the nonvolatile memory of the semiconductor device according to the first embodiment of the present invention.

FIG. 9 is one example of a circuit diagram of the nonvolatile memory according to the first embodiment and shows one example illustrative of applied voltages at data reading. Conditions for voltages applied to respective portions of each memory cell MC intended for selection upon the data reading are the same as those described in FIGS. 1 and 5. Incidentally, although a voltage of 3V is applied to a gate electrode of a selection MIS-FET QS of each memory cell MC intended for selection through a control gate wiring CG upon data reading in this case, the voltage of 0V (or open-circuit potential) has been applied to the semiconductor areas 7SW and 7DW for the source and drain, of the MIS-FETs QW for writing data intended for selection upon the data reading as mentioned above, thus causing no problem.

Figure 10:
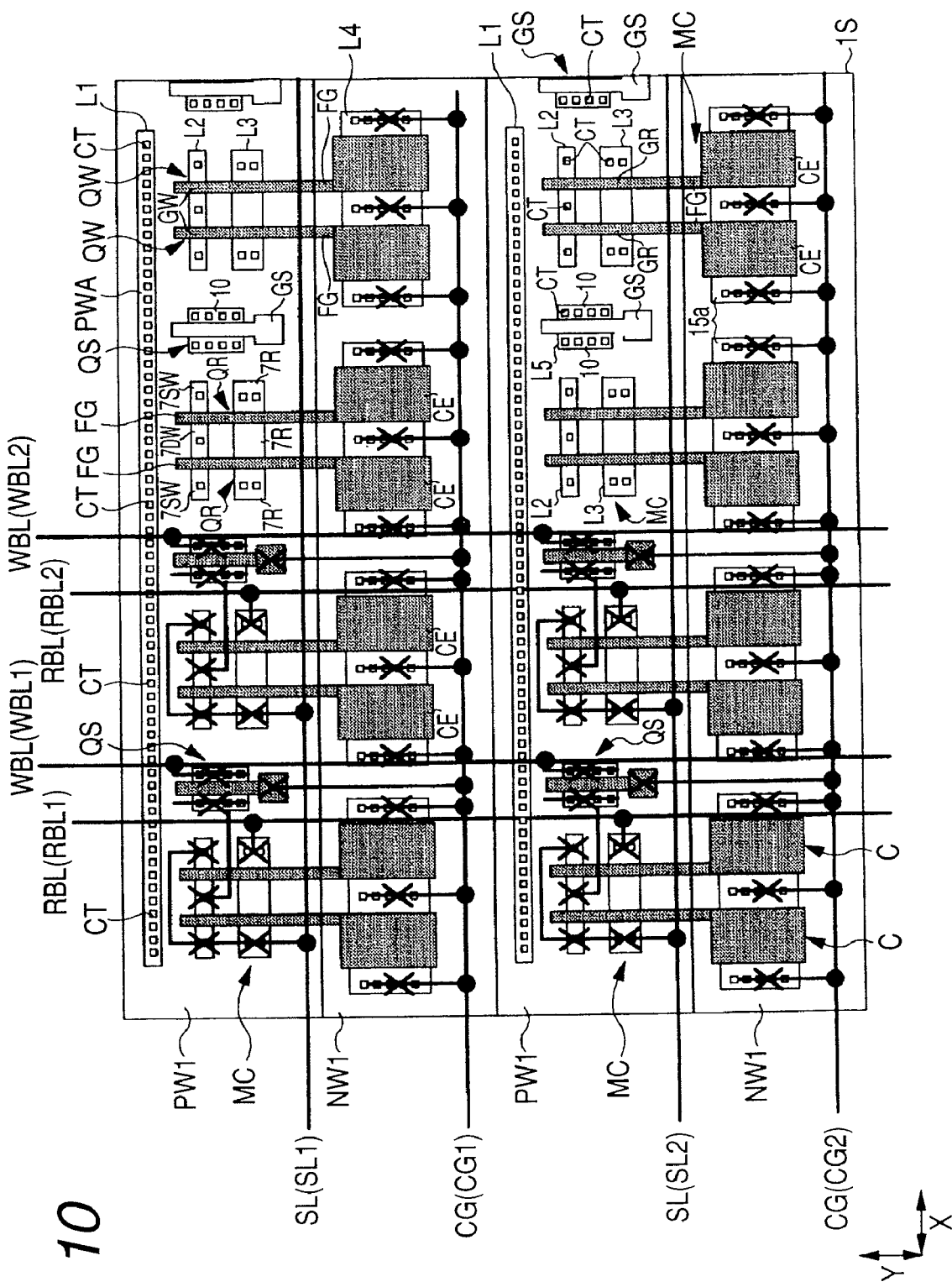
FIG. 10 is a fragmentary plan view of a memory cell array of the nonvolatile memory shown in FIGS. 8 and 9.
Figure 11:
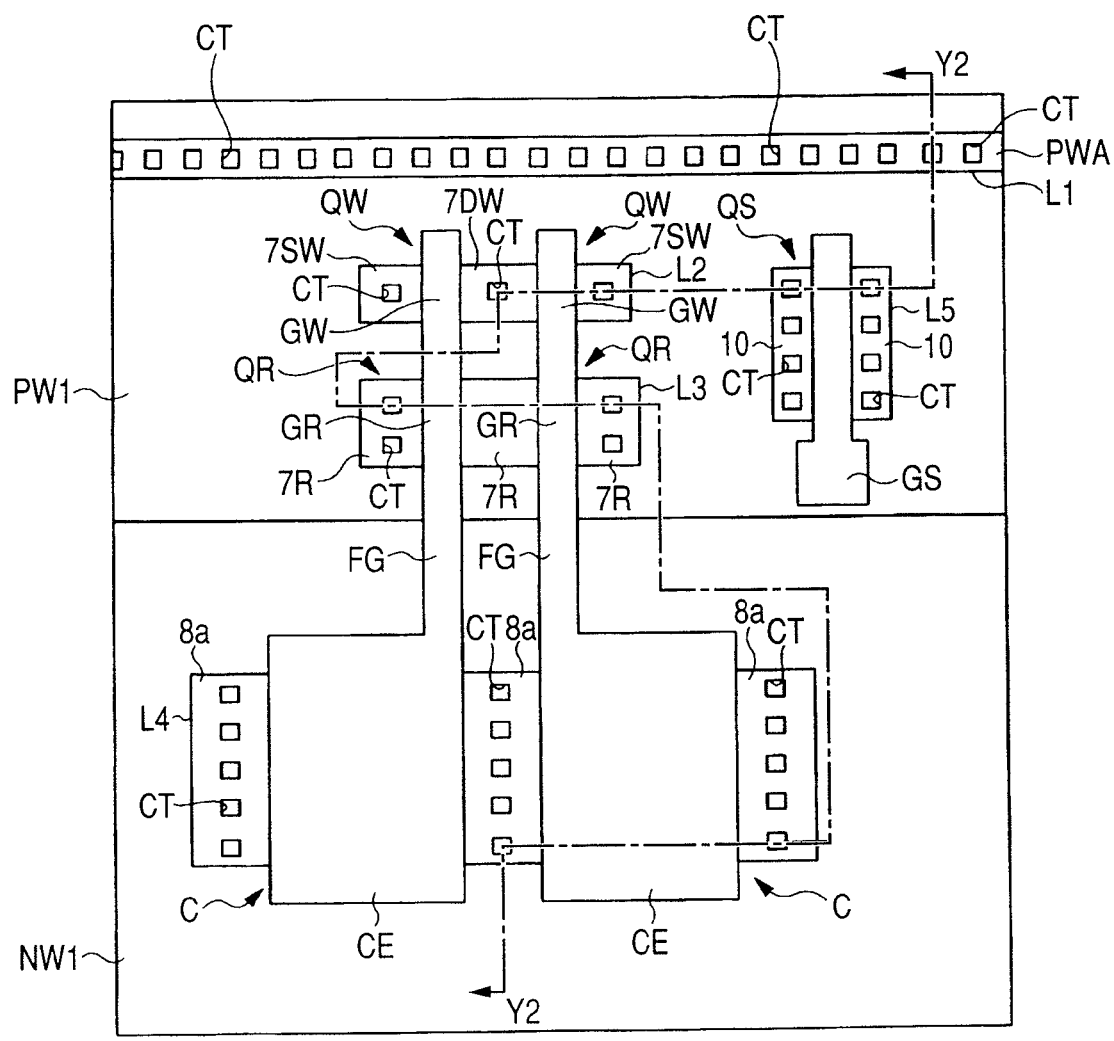
FIG. 11 is a fragmentary enlarged plan view showing a section corresponding to one bit, of the memory cell array of the nonvolatile memory shown in FIG. 10.
Figure 12:
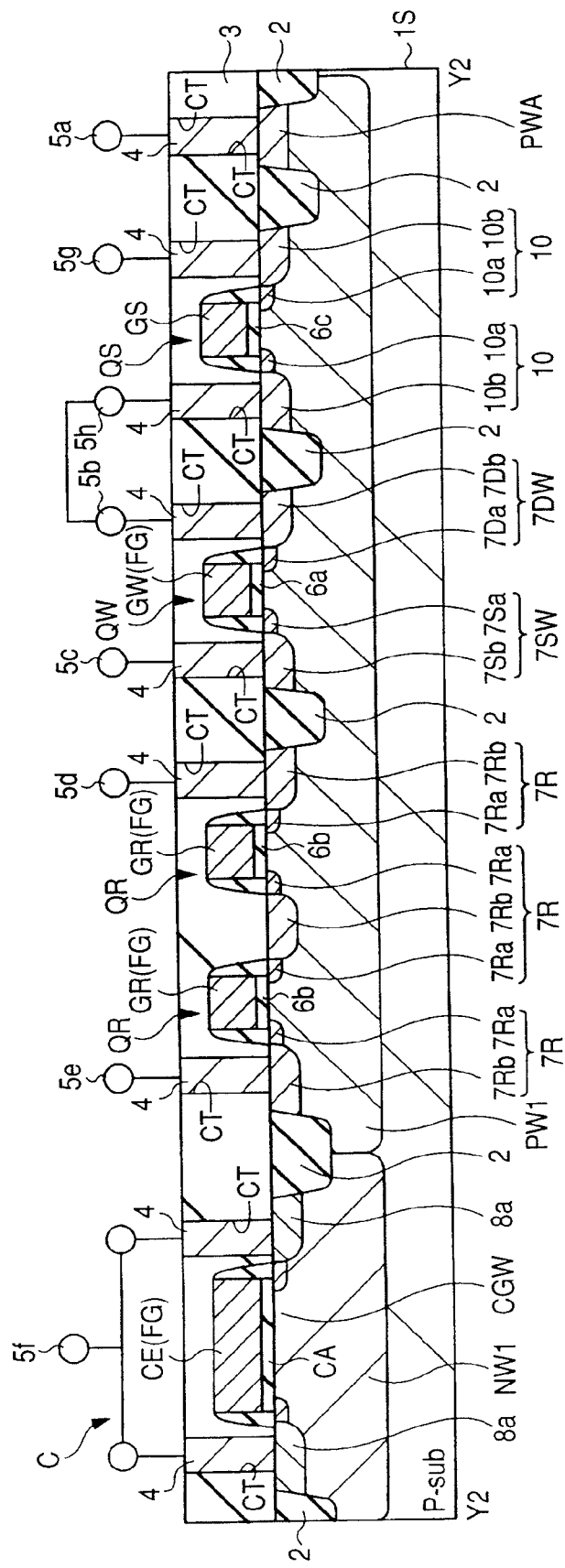
FIG. 12 is a cross-sectional view taken along line Y2-Y2 of FIG. 11.

Next, FIG. 10 shows a fragmentary plan view of a memory cell array of the nonvolatile memory shown in FIGS. 8 and 9, FIG. 11 illustrates a fragmentary enlarged plan view showing a section corresponding to one bit, of the memory cell array of the nonvolatile memory shown in FIG. 10, and FIG. 12 depicts a sectional view taken along line Y2-Y2 of FIG. 11, respectively.

A configuration of the nonvolatile memory is the same as that described in FIGS. 2 through 5 except for the configuration in which the selection MIS-FETs QS are disposed.

Each of the selection MIS-FETs QS is formed of, for example, an n channel type MIS-FET. They are disposed every one bit (i.e., two memory cells MCs) of the memory cell array. Each of the selection MIS-FETs QS is disposed in a position where an active region L5 in a p well PW1 is formed, and has a gate electrode GS, a gate insulating film 6c formed between the gate electrode GS and a substrate 1S (p well PW1) and a pair of n type semiconductor areas 10 and 10 for the source and drain, which is formed within the p well PW1 at a position where they interpose the gate electrode GS therebetween. The gate electrode GS is formed of, for example, low-resistance polycrystalline silicon and patterned in the same etching process as the floating gate electrode FG. A channel of the selection MIS-FET QS is formed in a layer above the p well PW1, where the gate electrode GS and the active region L5 overlap on a plane basis. The gate insulating film 6c is formed of, for example, the same silicon oxide as one for the gate insulating films 6a and 6b. The n type semiconductor areas 10 and 10 for the source and drain respectively have n⁻ type semiconductor areas 10a on the channel side and n⁺ type semiconductor areas 10b respectively connected thereto. For example, phosphorus or arsenic is contained in the n⁻ type semiconductor areas 10a and the n⁺ type semiconductor areas 10b. One of the pair of n type semiconductor areas 10 and 10 is electrically connected to an electrode 5g through a conductive section 4 lying in each contact hole CT and electrically connected to its corresponding data writing bit line WBL (WBL1, WBL2). The other of the pair of n type semiconductor areas 10 and 10 is electrically connected to an electrode 5h through a conductive section 4 lying in each contact hole CT and electrically connected to an electrode 5b through a metal wiring, followed by being electrically connected to its corresponding semiconductor area 7DW for the drain, of a MIS-FET QW for writing data. The electrodes 5g and 5h are respectively formed of, for example, a metal like aluminum or the like. Incidentally, since no problem occurs upon data reading in the OTPROM corresponding to the nonvolatile memory of the semiconductor device according to the first embodiment, no selection MIS-FETs are electrically connected to MIS-FETs QR for reading data.

Figure 13:
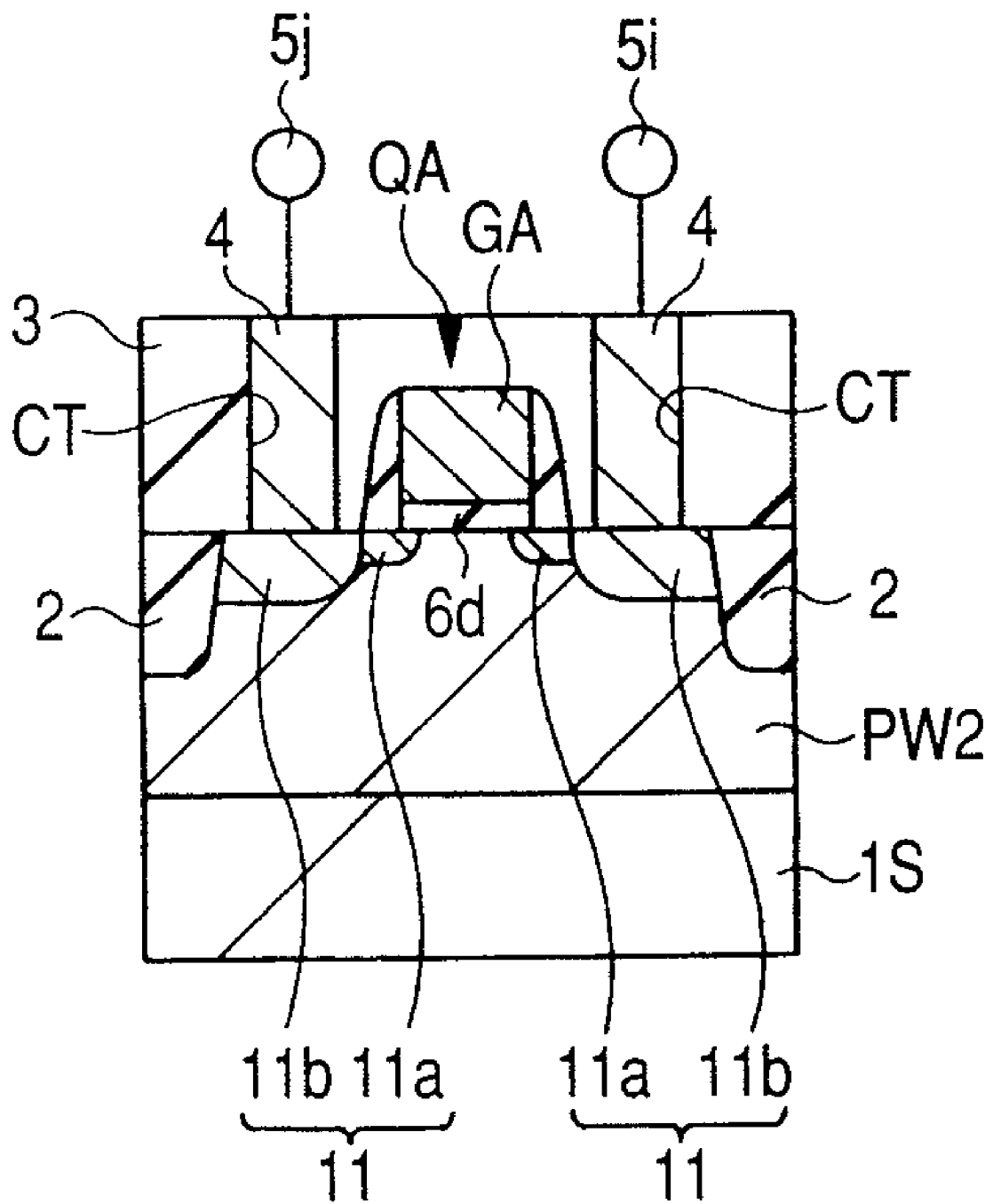
FIG. 13 is a cross-sectional view showing one example of a main circuit forming element formed in a main circuit forming area of a semiconductor chip formed with the nonvolatile memory shown in FIGS. 8 through 12.

Next, FIG. 13 shows a sectional view of one example of a main circuit forming element formed in a main circuit forming area of a semiconductor chip formed with the nonvolatile memory. Here, an n channel type MIS-FET QA is illustrated by way of example as the main circuit forming element. The MIS-FET QA is formed in an active region surrounded by separation sections 2 lying in a layer above a p well PW2 of a substrate 1S. The p well PW2 is formed simultaneously with the p well PW1. The MIS-FET QA has a gate electrode GA, a gate insulating film 6d formed between the gate electrode GA and the substrate 1S (p well PW2), and a pair of n type semiconductor areas 11 and 11 for the source and drain, which is formed within the p well PW2 at a position where they interpose the gate electrode GA therebetween. The gate electrode GA is constituted of, for example, low-resistance polycrystalline silicon and patterned in the same etching process as the floating gate electrode FG. That is, the gate electrode GA is formed of polycrystalline silicon of the same layer as the floating gate electrode FG.

A channel of the MIS-FET QA is formed in the layer above the p well PW2, where the gate electrode GA and the active region overlap on a plane basis. The gate insulating film 6d is formed of, for example, the same silicon oxide as the gate insulating films 6a through 6c.

A pair of n type semiconductor areas 11 and 11 for the source and drain has n⁻ type semiconductor areas 11a on the channel side and n⁺ type semiconductor areas 11b connected thereto, respectively. For example, phosphorus or arsenic is contained in the n⁻ type semiconductor areas 11a and the n⁺ type semiconductor areas 11b. One of the pair of n type semiconductor areas 11 and 11 is electrically connected to an electrode 5i through a conductive section 4 lying in a contact hole CT, whereas the other of the pair of n type semiconductor areas 11 and 11 is electrically connected to an electrode 5j through a conductive section 4 lying in a contact hole CT. The electrodes 5i and 5j are formed of, for example, a metal like aluminum or the like.

Second Preferred Embodiment

A second embodiment will explain a case in which a nonvolatile memory is an EEPROM (Electrically Erasable Programmable ROM).

Figure 14:
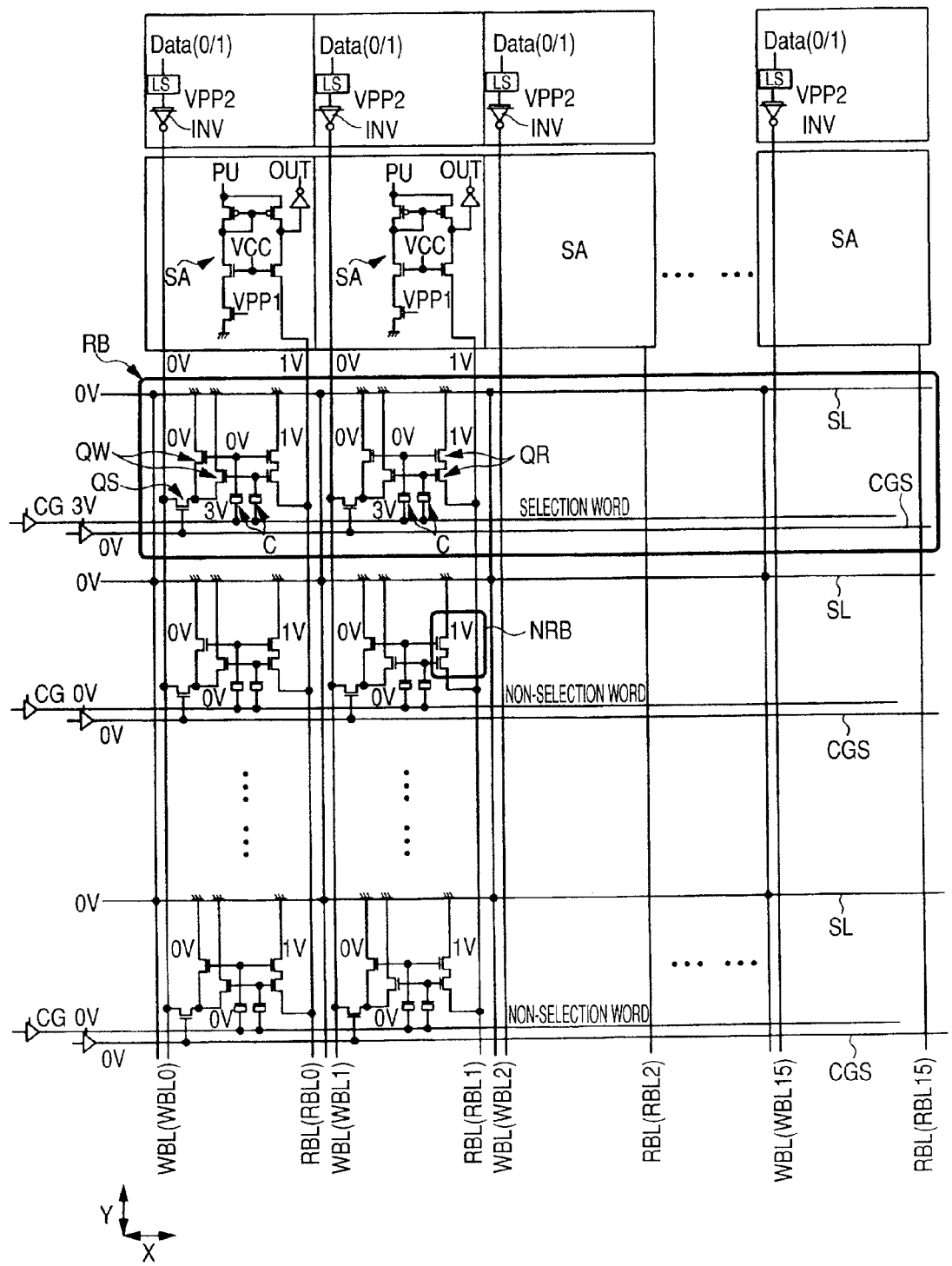
FIG. 14 is a circuit diagram of another nonvolatile memory discussed by the present inventors.

FIG. 14 shows a circuit diagram of a nonvolatile memory discussed by the present inventors upon forming the main circuits and the nonvolatile memory in the same semiconductor chip.

The nonvolatile memory is of an EEPROM capable of electrically writing and erasing the contents of data, for example. Even in this case, selection MIS-FETs QS are electrically connected to their corresponding MIS-FETs QW for writing data corresponding to respective bits of a memory cell array of the nonvolatile memory as mentioned above. It is therefore possible to avoid the problems about the data disturb and non-selection leak at each non-selected memory cell MC at a data write operation.

In the present embodiment, gate electrodes of a plurality of selection MIS-FETs QS arranged in a second direction X are electrically connected to their corresponding control wirings CGS. That is, the gate electrodes of the selection MIS-FETs QS are electrically connected to their corresponding control wirings CGS different from control gate wirings CG and are configured so as to be capable of supplying potentials as distinct from the supply of a potential to a control gate electrode of each memory cell MC. Circuit configurations other than above are identical to those described in FIGS. 1, 8 and 9. Incidentally, no selection MIS-FETs QR are electrically connected to MIS-FETs QR for reading data even here.

Figure 15:
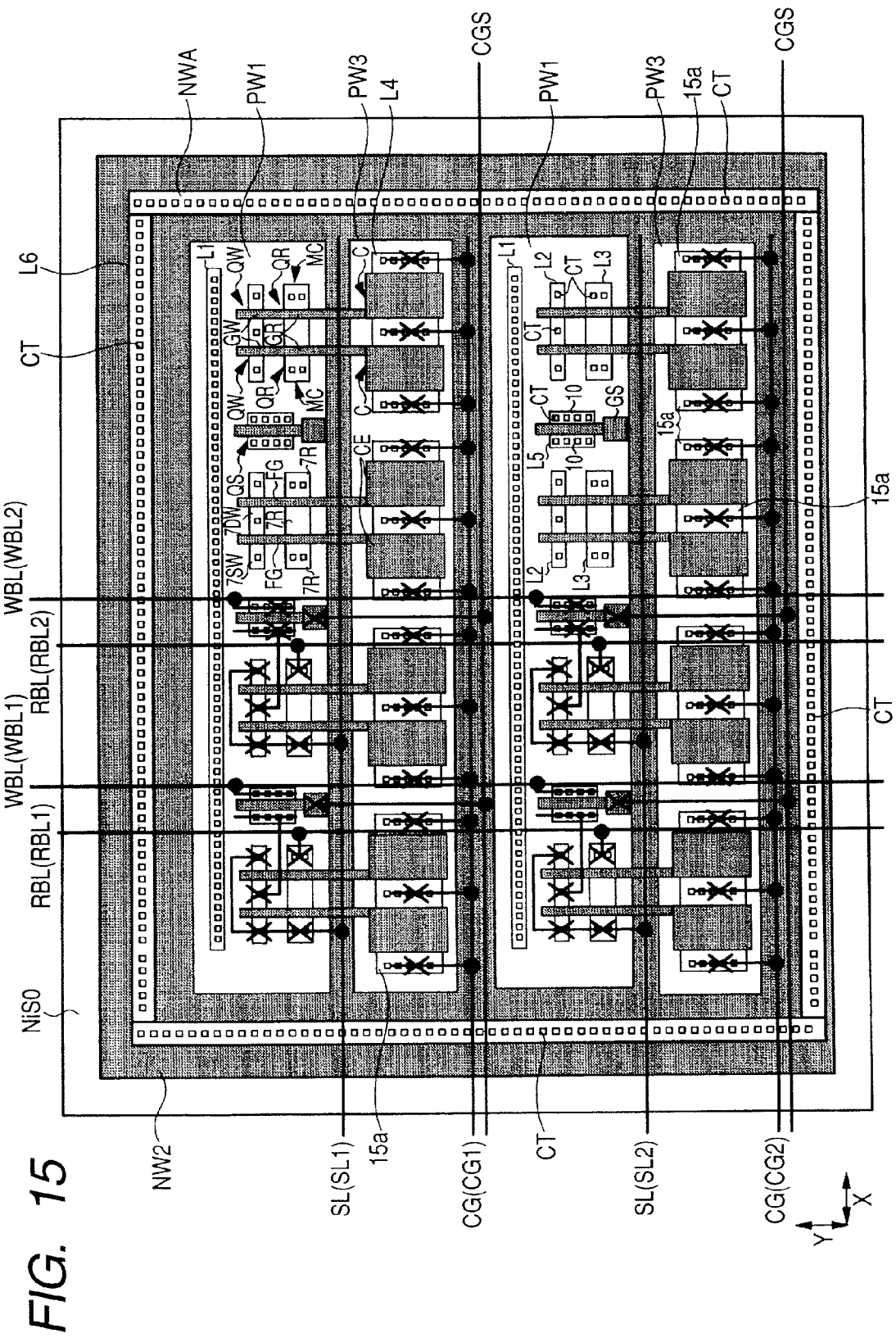
FIG. 15 is a fragmentary plan view of a memory cell array of the nonvolatile memory shown in FIG. 14.
Figure 16:
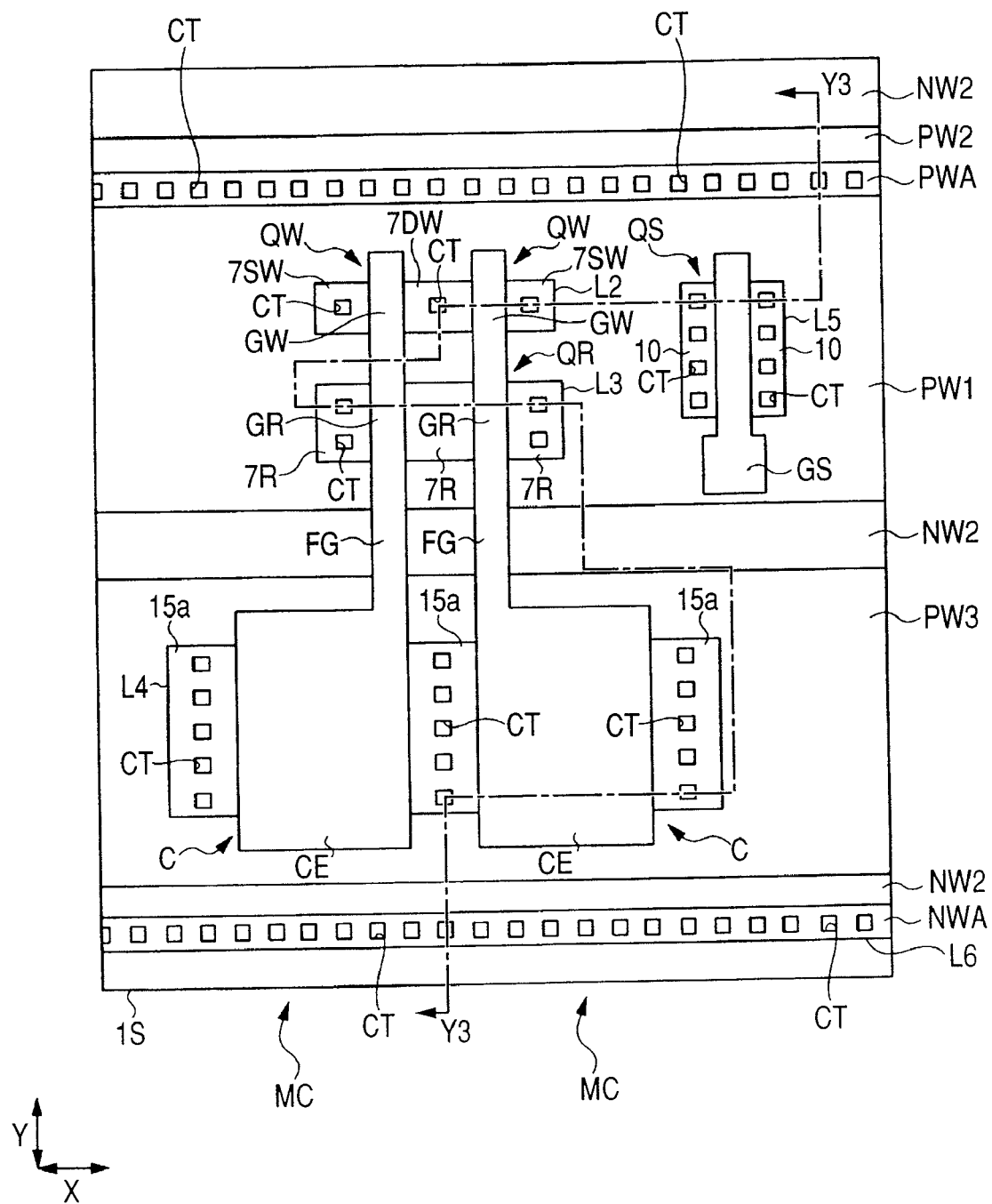
FIG. 16 is an enlarged plan view showing a section corresponding to one bit, of the memory cell array of the nonvolatile memory shown in FIG. 15.
Figure 17:
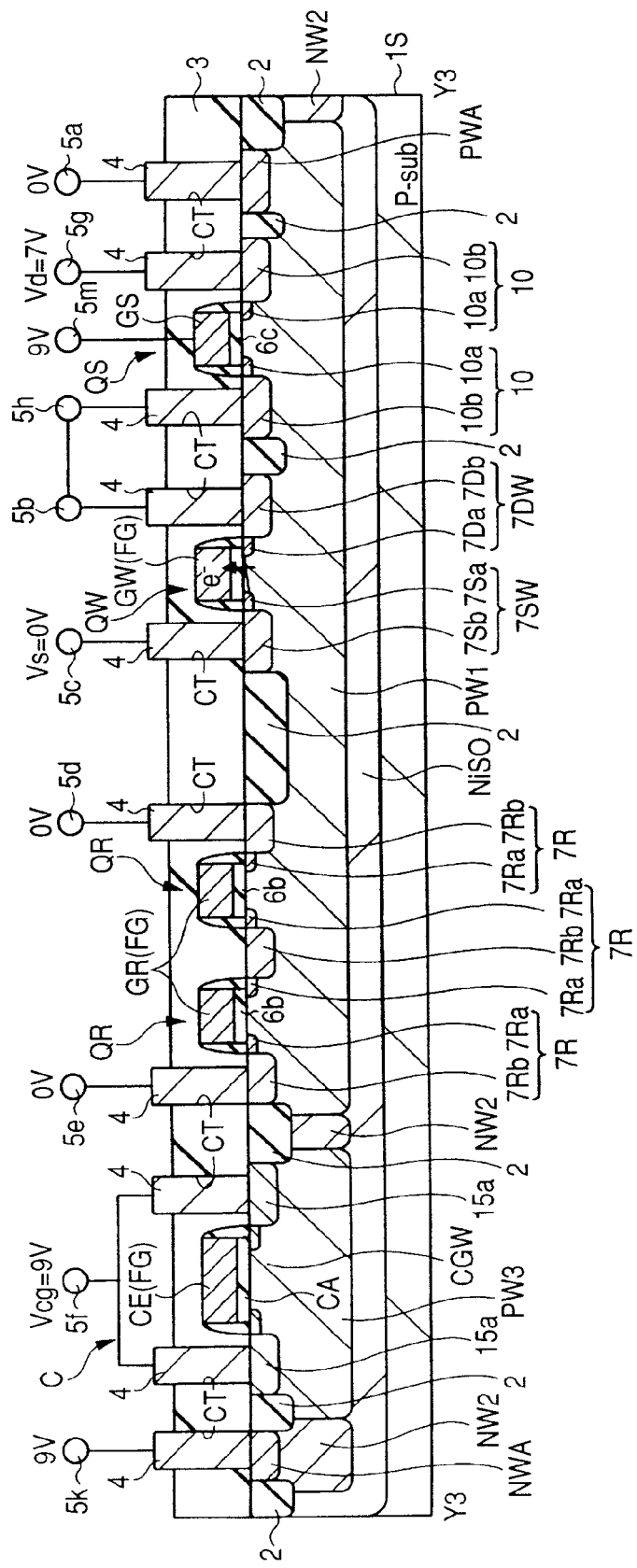
FIG. 17 is a cross-sectional view showing a spot equivalent to line Y3-Y3 of FIG. 16, of a selected memory cell at data writing.
Figure 18:
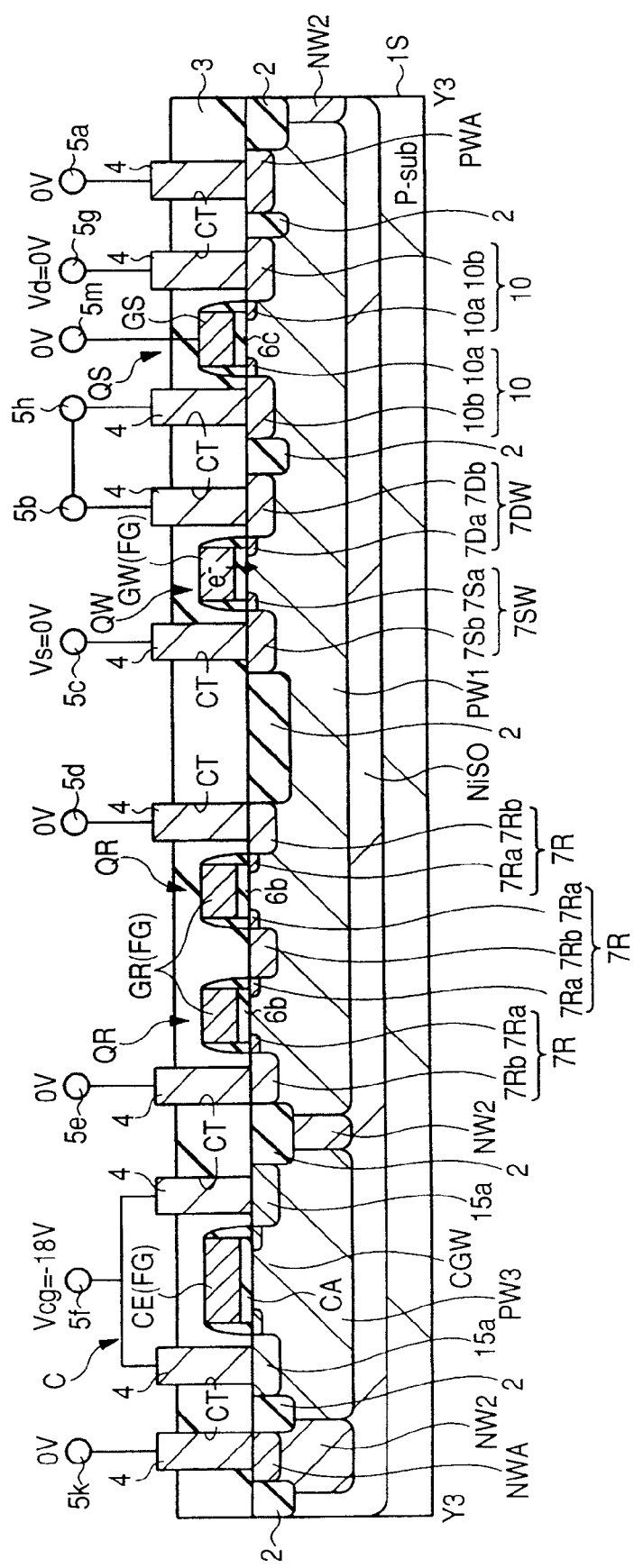
FIG. 18 is a cross-sectional view showing a spot equivalent to line Y3-Y3 of FIG. 16, of the selected memory cell at data erasure.
Figure 19:
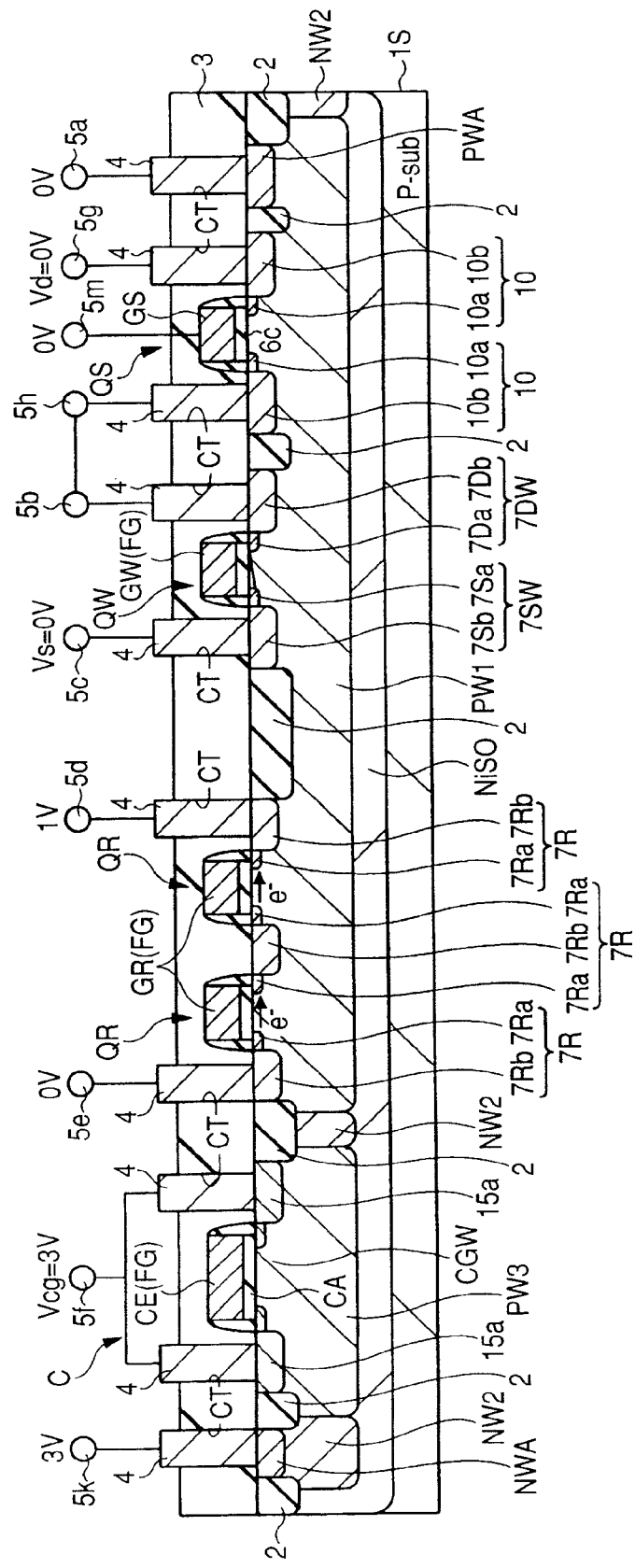
FIG. 19 is a cross-sectional view taken along line Y3-Y3 of FIG. 16, of the selected memory cell at data reading.

Next, FIG. 15 shows a fragmentary plan view of the memory cell array of the nonvolatile memory shown in FIG. 14, FIG. 16 shows an enlarged plan view showing a section corresponding to one bit, of the memory cell array of the nonvolatile memory shown in FIG. 15, FIG. 17 shows a sectional view showing a spot equivalent to line Y3-Y3 of FIG. 16, of a selected memory cell at data writing, FIG. 18 illustrates a sectional view showing a spot equivalent to line Y3-Y3 of FIG. 16, of the selected memory cell at data erasure, and FIG. 19 shows a sectional view taken along line Y3-Y3 of FIG. 16, of the selected memory cell at data reading, respectively.

The second embodiment is different from the first embodiment in that control gate electrodes CGW are formed of a p well PW3. The p well PW3 that functions as the control gate electrode CGW is electrically connected to its corresponding conductive sections 4 in contact holes CTs through p⁺ type semiconductor areas 15a placed on both the right and left sides of capacitance electrodes CEs as viewed in the plane and formed in an upper layer portion of the p well PW3 as viewed in section. The p well PW3 is electrically connected to its corresponding electrode 5*f* through the conductive sections 4 and electrically connected to the control gate wiring CG (CG1, CG2). The p$^+$ type semiconductor area 15*a* contains boron, for example.

In order to separate the p wells PW3 for forming the control gate electrodes CGW and the p wells PW1 located on the placement sides of the MIS-FET QW for writing (erasing) data and the MIS-FET QR for reading data, an n type embedding area NiSO and an n well NW2 are formed in a substrate 1 so as to surround the p wells PW1 and PW3 (so as to be interposed between the adjacent p wells PW1 and PW3).

The n type embedding area NiSO and n well NW2 contain phosphorus or arsenic, for example. The n type embedding area NiSO is formed so as to range up to the deepest position of the substrate 1S in a state of being in contact with the bottoms of the p wells PW1 and PW3 and the bottom and sides of the n well NW2. The n well NW2 is formed in a state of being in contact with the sides of the p wells PW1 and PW3 so as to surround the outer peripheries thereof. An active region L6 is disposed in an upper surface of the n well NW2 along its extending direction. A well power-feeding n$^+$ type semiconductor area NWA is formed in the active region L6. The well power-feeding n$^+$ type semiconductor area NWA is electrically connected to well power-feeding electrodes 5*k* through conductive sections 4 lying in a plurality of contact holes CTs. For example, phosphorus or arsenic is contained in the n$^+$ type semiconductor area NWA in high concentration. The electrode 5*k* is formed of, a metal like aluminum or the like. Incidentally, as described above, the selection MIS-FET QS is configured such that its gate electrode GS is electrically connected to its corresponding control wiring CGS through an electrode 5*m* and a metal wiring and thereby the operation thereof is controlled.

Next, one example illustrative of voltages applied to respective portions at a data write operation, of such a nonvolatile memory is shown in FIG. 17. Here, a voltage of about 9V, for example, is applied to the n well NW2 and the n type embedding area NiSO through the corresponding electrode 5*k* to electrically isolate the substrate 1S and the p wells PW1 and PW3 from one another. The voltages applied to the respective portions, other than above are identical to those described in FIGS. 4 and 8. That is, a voltage of 9V or so, for example, is applied from the corresponding control wiring CGS to a gate electrode GS of a selection MIS-FET QS corresponding to a bit intended for selection in a state in which a voltage of 7V or so, for example, has been applied from the corresponding control gate wiring CG to one semiconductor area 10 of the selection MIS-FET QS corresponding to each bit. Thus, the selection MIS-FET QS corresponding to the bit intended for selection is turned on to apply the voltage of about 7V to a semiconductor area 7DW for the drain, of each MIS-FET QW for writing data through the selection MIS-FET QS, whereby channel hot electrons (e$^-$) are injected into gate electrodes GW (floating gate electrodes FG) at the MIS-FETs QW and QW for writing data in a manner similar to the first embodiment to thereby carry out writing of data.

Next, one example illustrative of voltages applied to the respective portions at a data ease operation, of such a nonvolatile memory is shown in FIG. 18. At a memory cell (selected memory cell) intended for data erasure, a negative voltage of –18V, for example, is applied from the control gate wiring CG to the p well PW3 forming the control gate electrode CGW as a control voltage Vcg upon the data erasure. At this time, for example, 0V is applied to the electrodes 5*a*, 5*c* through 5*e*, 5*g*, 5*k* and 5*m*. Thus, the electrical charge (channel hot electrons (e$^-$)) stored in the floating gate electrode FG is discharged from the gate electrode GW of each MIS-FET QW for writing data to the p well PW1 in accordance with an FN tunnel current system to thereby erase data.

For example, the following may be carried out as an alternative to the erase operation. A voltage of 9V or so, for example, is applied to the n well NW2 and n type embedding area NiSO through the corresponding electrode 5*k*, a voltage of 9V or so, for example, is applied to the p well PW1 through the corresponding electrode 5*a*, and a reverse voltage of –9V, for example, is applied to the p well PW3 for the formation of the control gate electrode CGW through the corresponding electrode 5*f* to thereby bring the sources and drains of the MIS-FET QW for writing (erasing) data and MIS-FET QR for reading data to open-circuit potentials respectively. Thus, the electrical charge stored in each floating gate electrode FG is discharged into the p well PW1 in accordance with an FN tunnel current system to erase data. As a result, the deterioration of each element caused by the concentration of an electric field on each of the ends of the drains of the MIS-FET QW for writing (erasing) data and MIS-FET QR for reading data can be suppressed or prevented. It is therefore possible to suppress or prevent an unwanted leak of charge and suppress or prevent degradation of a data retention characteristic of the nonvolatile memory. Further, a negative (reverse) voltage is applied to the p well PW3 formed with each capacitive element and a positive (forward) voltage is applied to the p well PW1 formed with the MIS-FETs QW and QR to thereby make it possible to ensure a potential difference (18V) necessary for the data erase operation by virtue of a voltage (9V or less) that causes no gate breakdown.

Next, one example illustrative of voltages applied to the respective portions at a data read operation, of such a nonvolatile memory is shown in FIG. 19. The data read operation in this case is performed in a manner similar to one described in the first embodiment on condition that the MIS-FET QR for reading data of the selected memory cell MC is held on. Further, either 0 or 1 is read as data stored in the selected memory cell MC according to whether a drain current flows through a channel of the MIS-FET QR for reading data. The voltages applied to the respective portions at the data reading are substantially identical to those described in FIGS. 5 and 9. Different points reside in that a voltage of about 3V, for example, is applied to the n well NW2 and n type embedding area NiSO through the corresponding electrode 5*k* to electrically isolate the substrate 1S and the p wells PW1 and PW3 from one another, and for example, 0V is applied to the gate electrode GS of the selection MIS-FET QS electrically connected to its corresponding MIS-FET QW for writing data to turn off the selection MIS-FET QS.

Figure 20:
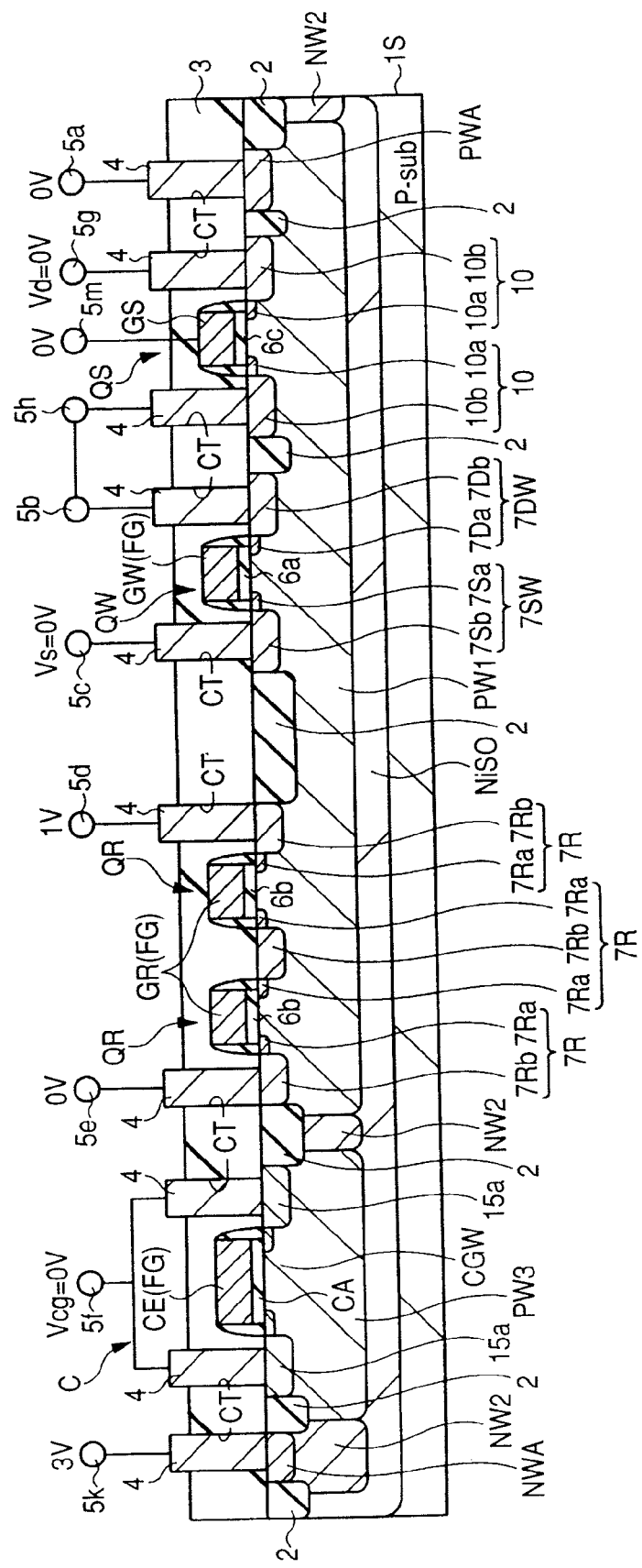
FIG. 20 is a cross-sectional view taken along line Y3-Y3 of FIG. 16, of a non-selected memory cell at data reading.

Meanwhile, when the memory cells MCs referred to above are disposed in array form as described above, the above nonvolatile memory (EEPROM) causes the following problems upon its data read operation. It has been found out for the first time by the present inventors that the cells of the nonvolatile memory cannot simply be laid out in array form. This will be explained with reference to FIGS. 14 and 20. Incidentally, symbol RB shown in FIG. 14 indicates a read bit intended for reading, and symbol NRB indicates a non-read bit intended for non-reading. FIG. 20 is a sectional view taken along line Y3-Y3 of FIG. 16, of a non-selected memory cell MC at data reading.

That is, the EEPROM has the problem that the corresponding MIS-FET QR for reading data of the non-selected memory cell MC is turned on despite the intention upon the data read operation, thus causing a misjudgment (misreading) on data. This is a problem that arises due to the fact that there is a case where an electrical charge that contributes to the storage of information at a data erase operation is excessively pulled out in the case of the EEPROM, so that the threshold voltage of the MIS-FET QR for reading data is reduced. It is also a problem that causes due to the face that the MIS-FET QR for reading data of the non-selected memory cell MC, which is reduced in threshold voltage, is turned on in an unwanted state as described above regardless of the MIS-FET QR for reading data of the memory cell MC intended for selection is off upon the data read operation, so that a current flows between the source and drain of the MIS-FET QR for reading data. Incidentally, since no erase operation exists in the OTPROM described in the first embodiment, such a problem does not occur.

Thus, in the second embodiment, the selection MIS-FETs are electrically connected to the respective MIS-FETs QR for reading data of the plurality of memory cells MCs, and the application of a read voltage to the drain of the MIS-FET QR for reading data of each non-selected memory cell MC is prevented, whereby each MIS-FET QR for reading data is controlled so as not to be turned on despite the intention.

Figure 21:
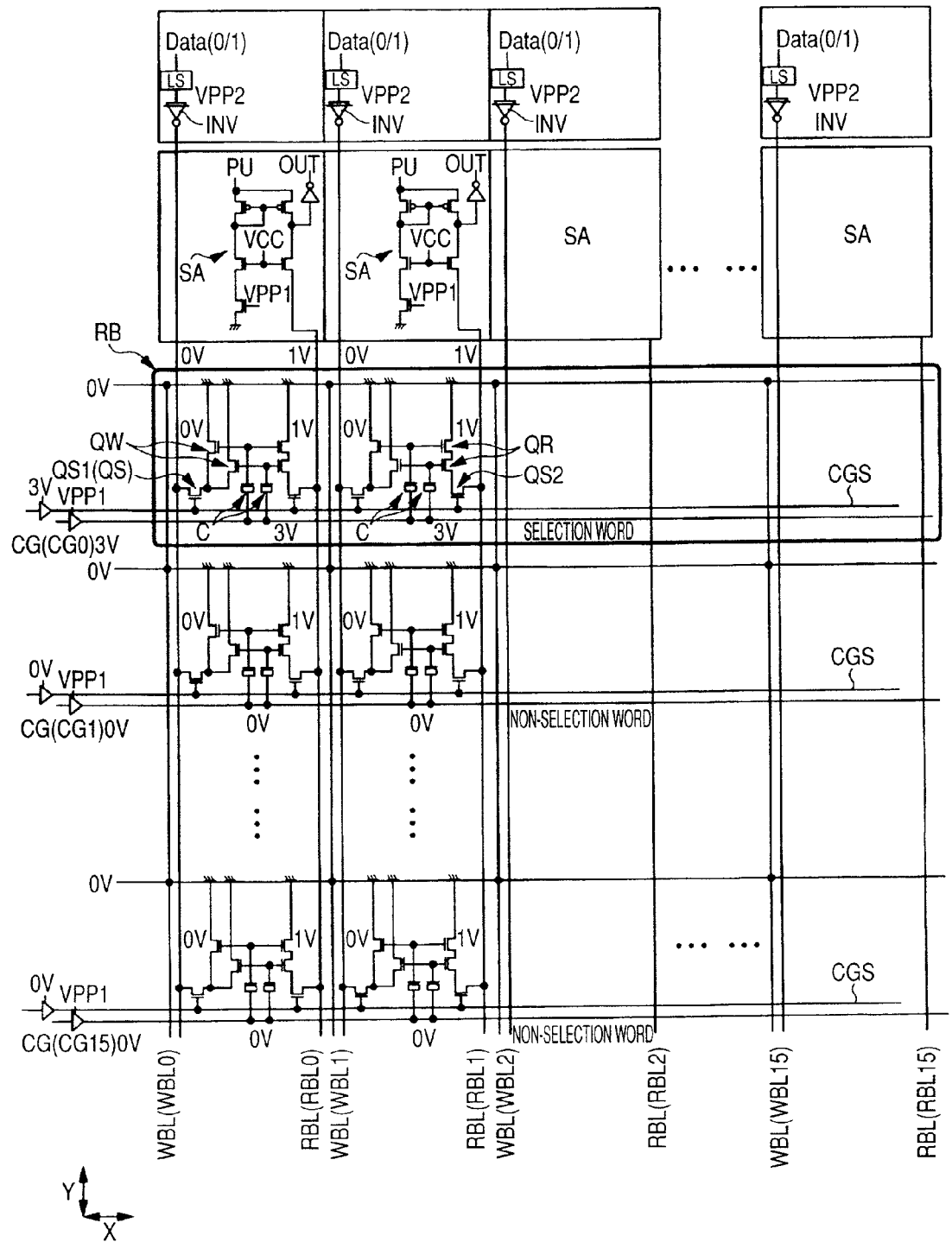
FIG. 21 is a circuit diagram showing one example illustrative of applied voltages at data reading of a nonvolatile memory of a semiconductor device according to a second embodiment of the present invention.

FIG. 21 is one example of a circuit diagram of the nonvolatile memory according to the second embodiment and shows one example illustrative of applied voltages at data reading.

In the second embodiment, selection MIS-FETs QS2 are respectively electrically connected between the drains (one semiconductor region or area) of MIS-FETs QR for reading data and data reading bit lines RBL with respect to respective bits of the nonvolatile memory. That is, the gate electrode of each selection MIS-FET QS2 is electrically connected to its corresponding control wiring CGS. One of the source and drain of the MIS-FET QS2 is electrically connected to its corresponding data reading bit line RBL, whereas the other thereof is electrically connected to the drains (one semiconductor area) of the two MIS-FETs QR for reading data connected in parallel. In the second embodiment, each of selection MIS-FET QS1 (QS) is electrically connected between the drains of MIS-FETs QW for writing data and the corresponding data writing bit line WBL in a manner similar to the cases described in the first embodiment and FIG. 14. That is, in the second embodiment, the selection MIS-FETs QS2 and QS1 are respectively electrically connected to both of the MIS-FET QR for reading data and the MIS-FET QW for writing data.

Figure 22:
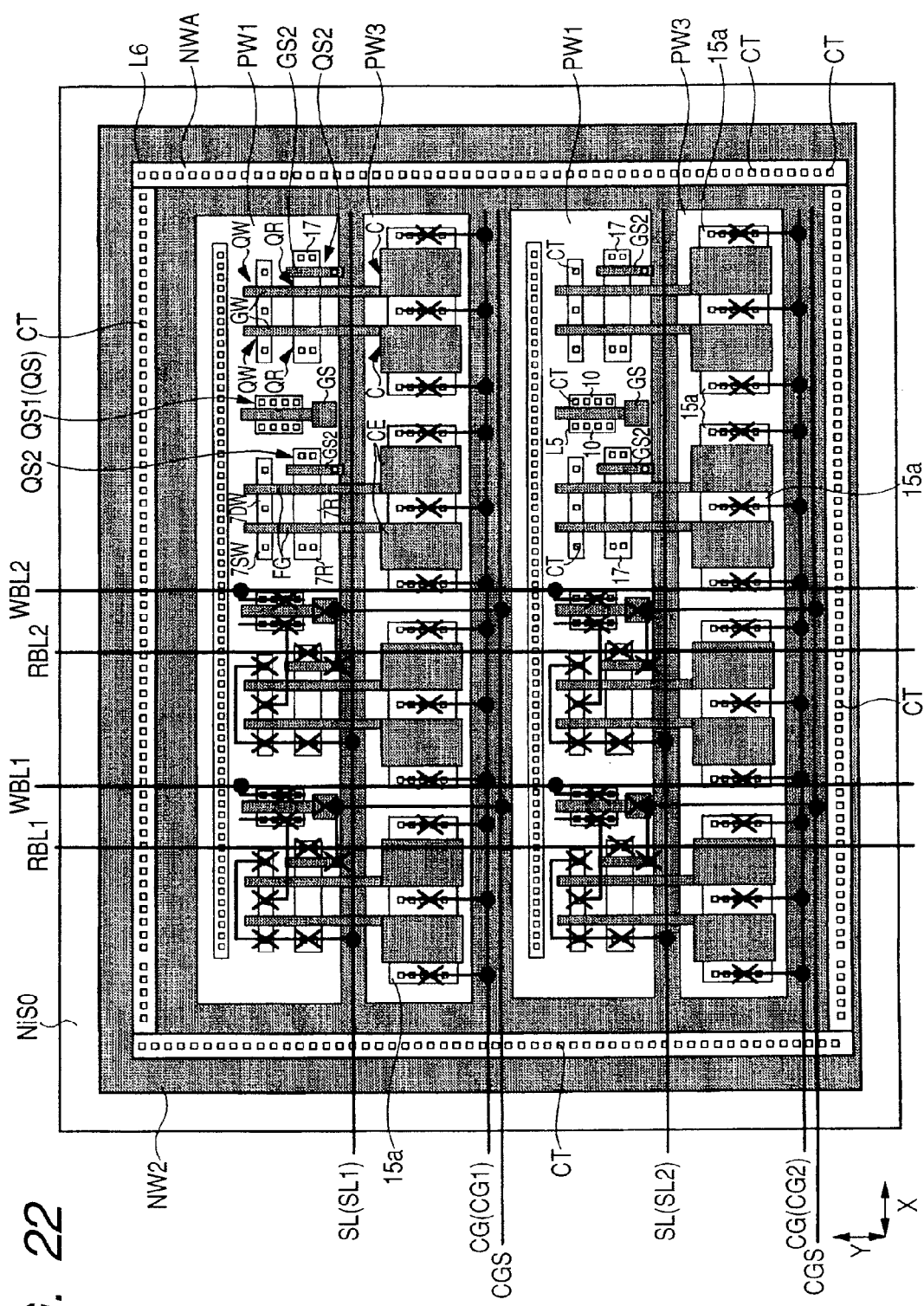
FIG. 22 is a fragmentary plan view of a memory cell array of the nonvolatile memory shown in FIG. 21.
Figure 23:
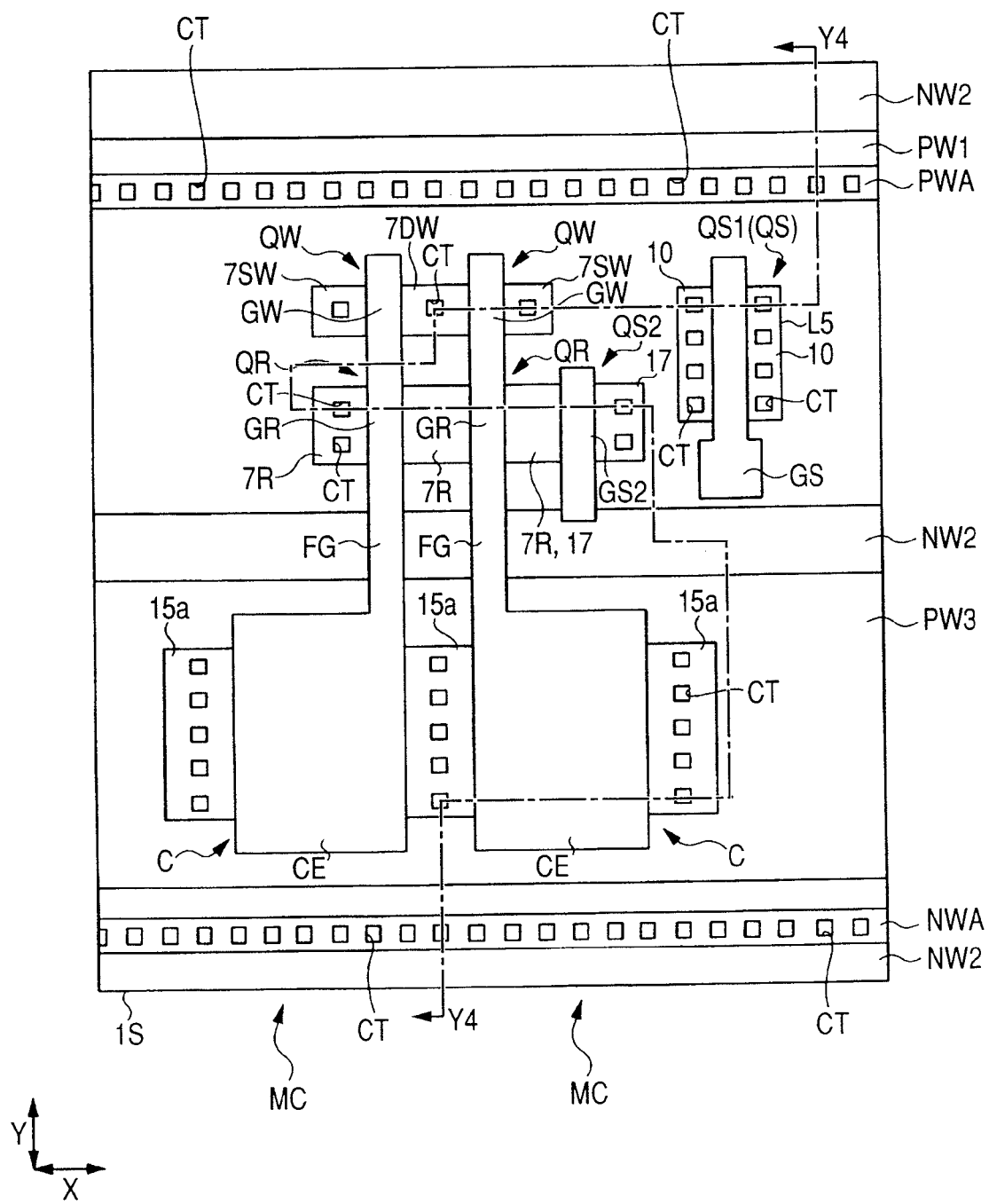
FIG. 23 is an enlarged plan view showing a section corresponding to one bit, of the memory cell array of the nonvolatile memory shown in FIG. 21.
Figure 24:
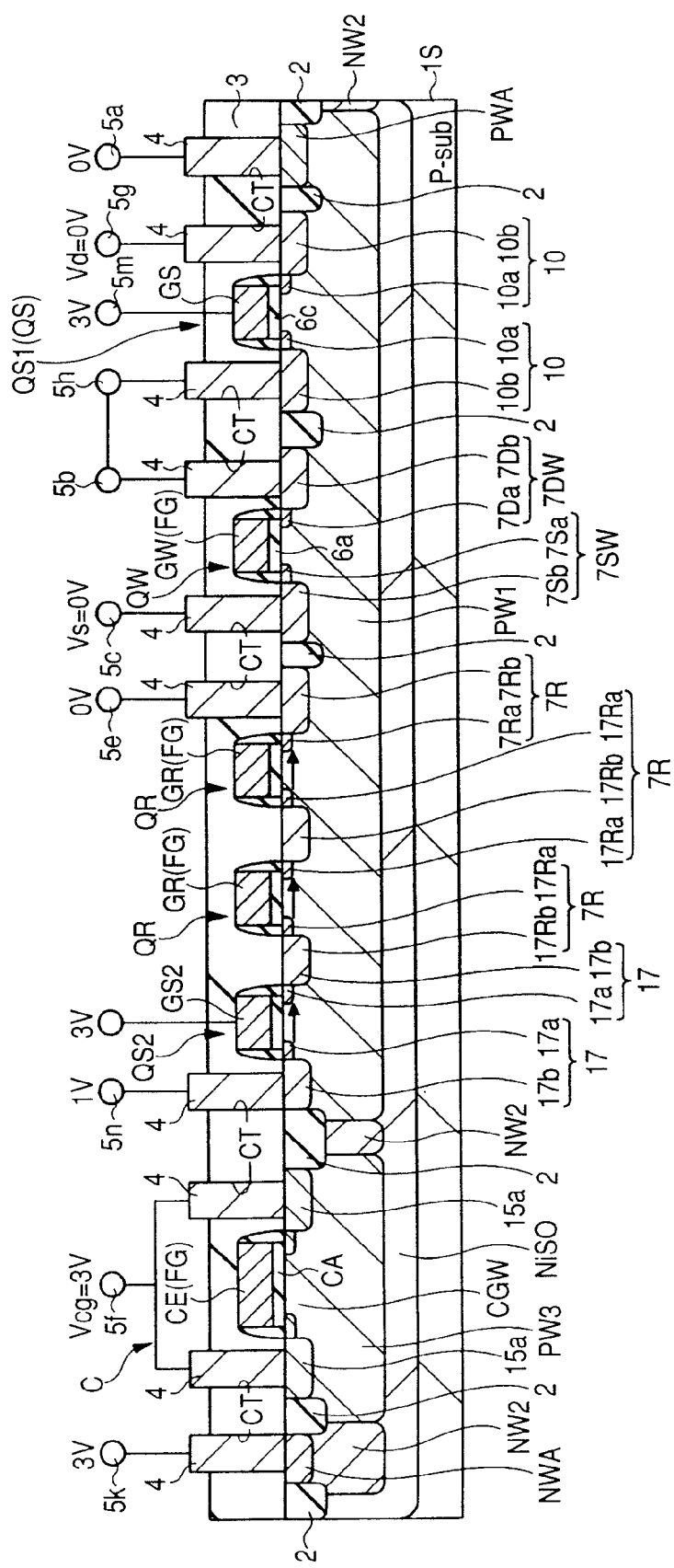
FIG. 24 is a cross-sectional view taken along line Y4-Y4 of FIG. 23, of a memory cell to be selected at data reading/writing.
Figure 25:
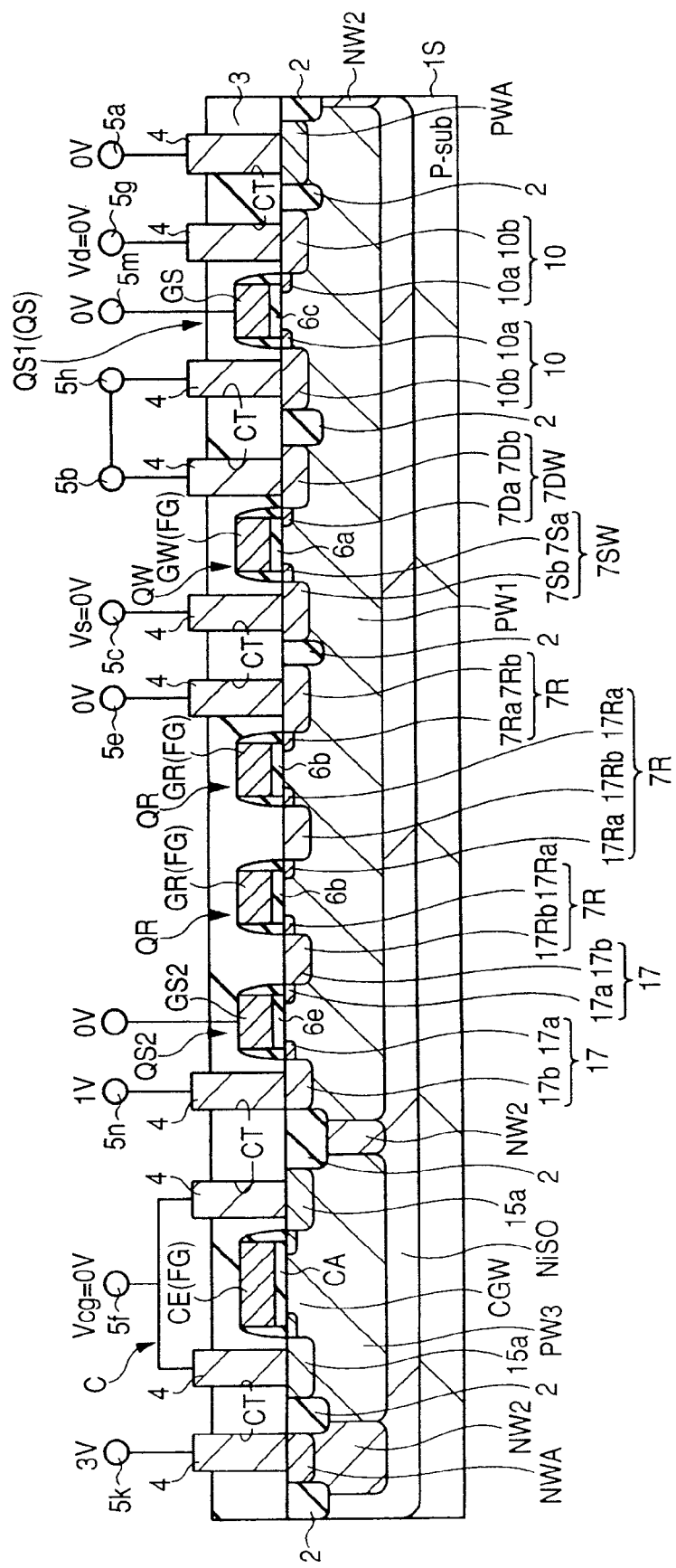
FIG. 25 is a cross-sectional view taken along line Y4-Y4 of FIG. 23, of a non-selected memory cell at data reading.

Next, FIG. 22 shows a fragmentary plan view of a memory cell array of the nonvolatile memory shown in FIG. 21, FIG. 23 shows an enlarged plan view showing a section corresponding to one bit, of the memory cell array of the nonvolatile memory shown in FIG. 21, FIG. 24 shows a sectional view taken along line Y4-Y4 of FIG. 23, of a memory cell MC intended for selection at data reading/writing, and FIG. 25 shows a sectional view taken along line Y4-Y4 of FIG. 23, of a non-selected memory cell MC at data reading, respectively. Incidentally, the explanations of main circuits formed in the substrate formed with the nonvolatile memory shown in FIG. 21 will be omitted because the MIS-FETs QA shown in FIG. 13 can be illustrated by way of example.

A configuration of the nonvolatile memory is the same as that described in FIGS. 15 through 20 except for the configuration in which the selection MIS-FETs QS2 are disposed.

Each of the selection MIS-FETs QS2 is formed of, for example, an n channel type MIS-FET. They are disposed every one bit (i.e., two memory cells MCs) of the memory cell array. Each of the selection MIS-FETs QS2 is disposed in a position where an active region L3 in a p well PW1 is formed, and has a gate electrode QS2, a gate insulating film 6e formed between the gate electrode GS2 and a substrate 1S (p well PW1) and a pair of n type semiconductor areas 17 and 17 for the source and drain, which is formed within the p well PW1 at a position where they interpose the gate electrode GS2 therebetween. The gate electrode G2S and the gate insulating film 6e are identical to the gate electrode GS and the gate insulating film 6c. A channel of the selection MIS-FET QS2 is formed in a layer above the p well PW1, where the gate electrode GS2 and the active region L3 overlap on a plane basis. The n type semiconductor areas 17 and 17 for the source and drain of the selection MIS-FET QS2 respectively have n⁻ type semiconductor areas 17a on the channel side and n⁺ type semiconductor areas 17b respectively connected thereto. For example, phosphorus or arsenic is contained in the n⁻ type semiconductor areas 17a and the n⁺ type semiconductor areas 17b. One of the pair of n type semiconductor areas 17 and 17 is electrically connected to an electrode 5n through a conductive section 4 lying in each contact hole CT and electrically connected to its corresponding data reading bit line RBL (RBL1, RBL2). The other of the pair of n type semiconductor areas 17 and 17 is shared for one of a pair of n type semiconductor areas 7R and 7R for the source and drain of each MIS-FET QR for reading data. That is, each MIS-FET QS is electrically series-connected to its corresponding MIS-FET QR for reading data through the shared semiconductor areas 7R and 17. The material for the electrode 5n is identical to the above electrode 5a or the like.

A data read operation of such a nonvolatile memory (EEPROM) will next be explained with reference to FIGS. 21 through 25. Conditions for voltages applied to the respective portions of each memory cell MC intended for selection upon data reading are the same as described in FIGS. 5, 9, 14 and 19.

In the case of the memory cell MC intended for selection in the second embodiment, a voltage of 3V is applied to the gate electrode of the selection MIS-FET QS2 through the corresponding control wiring CGS upon the data read operation. Therefore, the selection MIS-FET QS2 is turned on so that a voltage of 1V is applied to the drains (one semiconductor area) of the MIS-FETs QR for reading data of the memory cell MC via the selection MIS-FET QS2, whereby satisfactory data reading is carried out. On the other hand, a voltage of 0V is applied to the gate electrode of each selection MIS-FET QS2 through the corresponding control wiring CGS in a non-selected memory cell MC electrically connected to its corresponding data reading bit line RBL intended for selection. Therefore, the selection MIS-FET QS2 is not turned on, i.e., no 1V voltage is applied to the drain (one semiconductor area) of each MIS-FET QR for reading data of the non-selected memory cell MC, thereby making it possible to prevent the MIS-FET QR for reading data from being turned on despite the intention. Thus, since it is possible to prevent the MIS-FET QR for reading data of the non-selected memory cell MC from being turned on despite the intention upon data reading in the second embodiment, a problem about a misjudgment of read data can be avoided. Accordingly, the memory cells of the small-capacity nonvolatile memory (EEPROM) can be disposed in the semiconductor chip formed with the main circuits in array form, and the occupied area of the nonvolatile memory can be reduced in size. Therefore, the added values of the semiconductor device can be enhanced without incurring an increase in the size of the semiconductor chip formed with the main circuits.

A data write operation of such a nonvolatile memory (EEPROM) will next be explained with reference to FIGS. 26 and 27.

Figure 26:
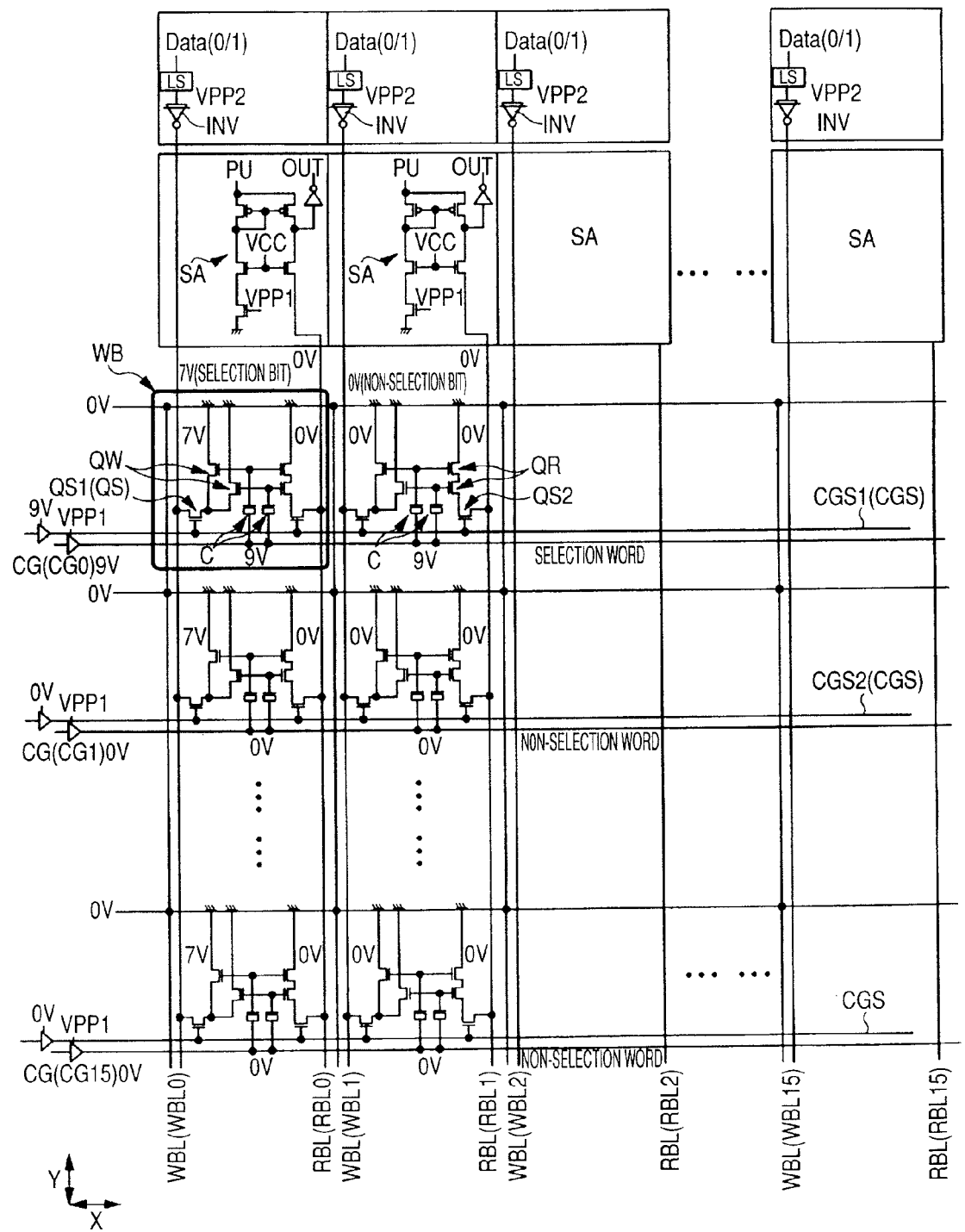
FIG. 26 is a circuit diagram at the operation of writing into a memory cell to be selected, of the nonvolatile memory of the semiconductor device according to the second embodiment of the present invention.
Figure 27:
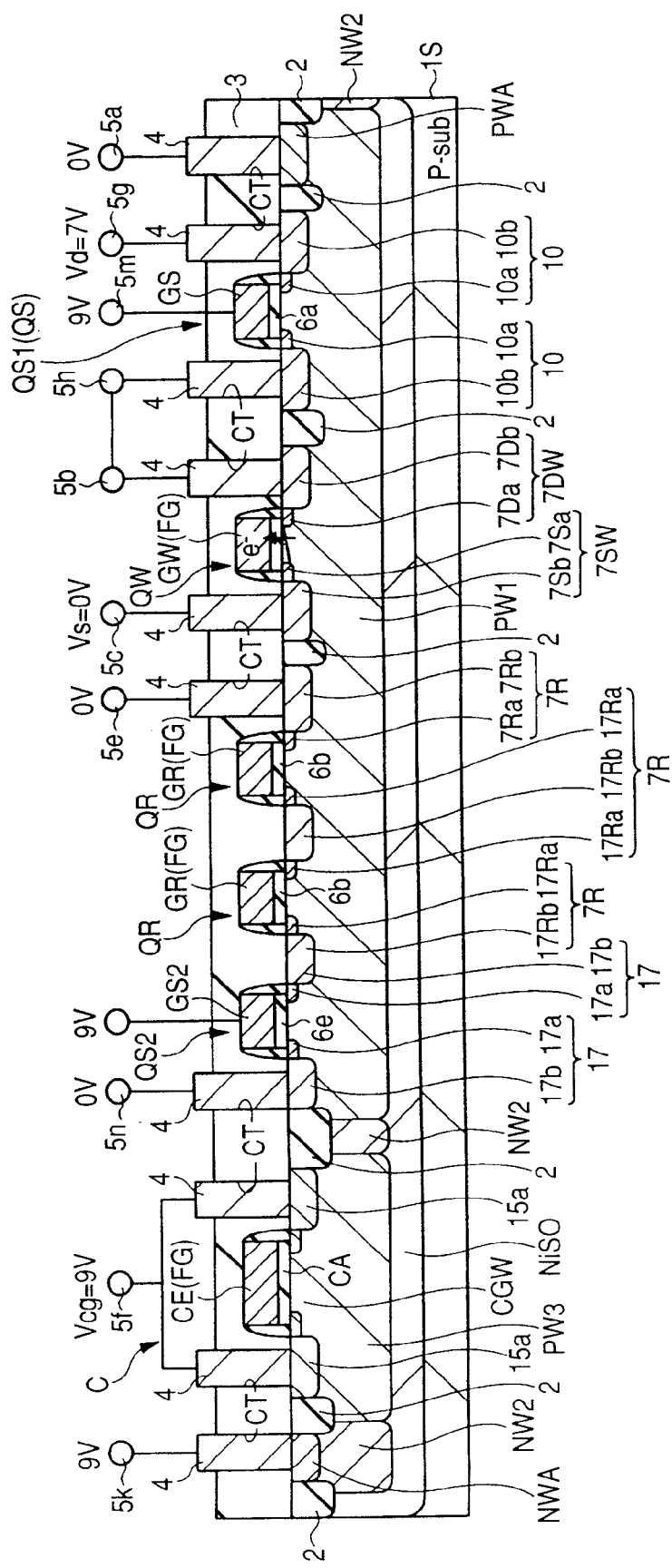
FIG. 27 is a fragmentary sectional view showing examples of voltages applied to respective portions at the operation of writing into the selected memory cell of the nonvolatile memory shown in FIG. 26.

FIGS. 26 and 27 respectively show a circuit diagram at the operation of writing into each memory cell to be selected, of the nonvolatile memory (EEPROM) of the second embodiment, and a fragmentary sectional view showing examples of voltages applied to respective portions thereof. Incidentally, conditions for the voltages applied to the respective portions of the memory cell MC intended for selection are the same as those described in FIGS. 4 and 8. In a manner similar to the case shown in FIG. 8, a voltage of 9V is applied to the gate electrode of each MIS-FET QS1 through the corresponding control wiring CGS1 upon the data write operation in the memory cell MC intended for selection. Therefore, the selection MIS-FET QS1 is turned on so that a voltage of 7V is applied to the corresponding semiconductor area 7DW for the drain, of the MIS-FET QW for writing data of the memory cell MC intended for selection, whereby satisfactory data writing is carried out. On the other hand, a voltage of 0V is applied to the gate electrode of the selection MIS-FET QS1 through the corresponding control wiring CGS2 in each non-selected memory cell MC electrically connected to its corresponding data writing bit line WBL. Therefore, the selection MIS-FET QS1 is not turned on so that the voltage of 7V is not applied to the corresponding semiconductor area 7DW for the drain, of the MIS-FET QW for writing data of the non-selected memory cell MC. It is therefore possible to avoid the problems about the data disturb and non-selection leak produced in each non-selected memory cell MC upon the data writing. Accordingly, the memory cells of the small-capacity nonvolatile memory (EEPROM) can be disposed in array form in the semiconductor chip formed with the main circuits, and the occupied area of the nonvolatile memory can be reduced. Therefore, the added values of the semiconductor device can be enhanced without incurring an increase in the size of the semiconductor chip formed with the main circuits.

Figure 28:
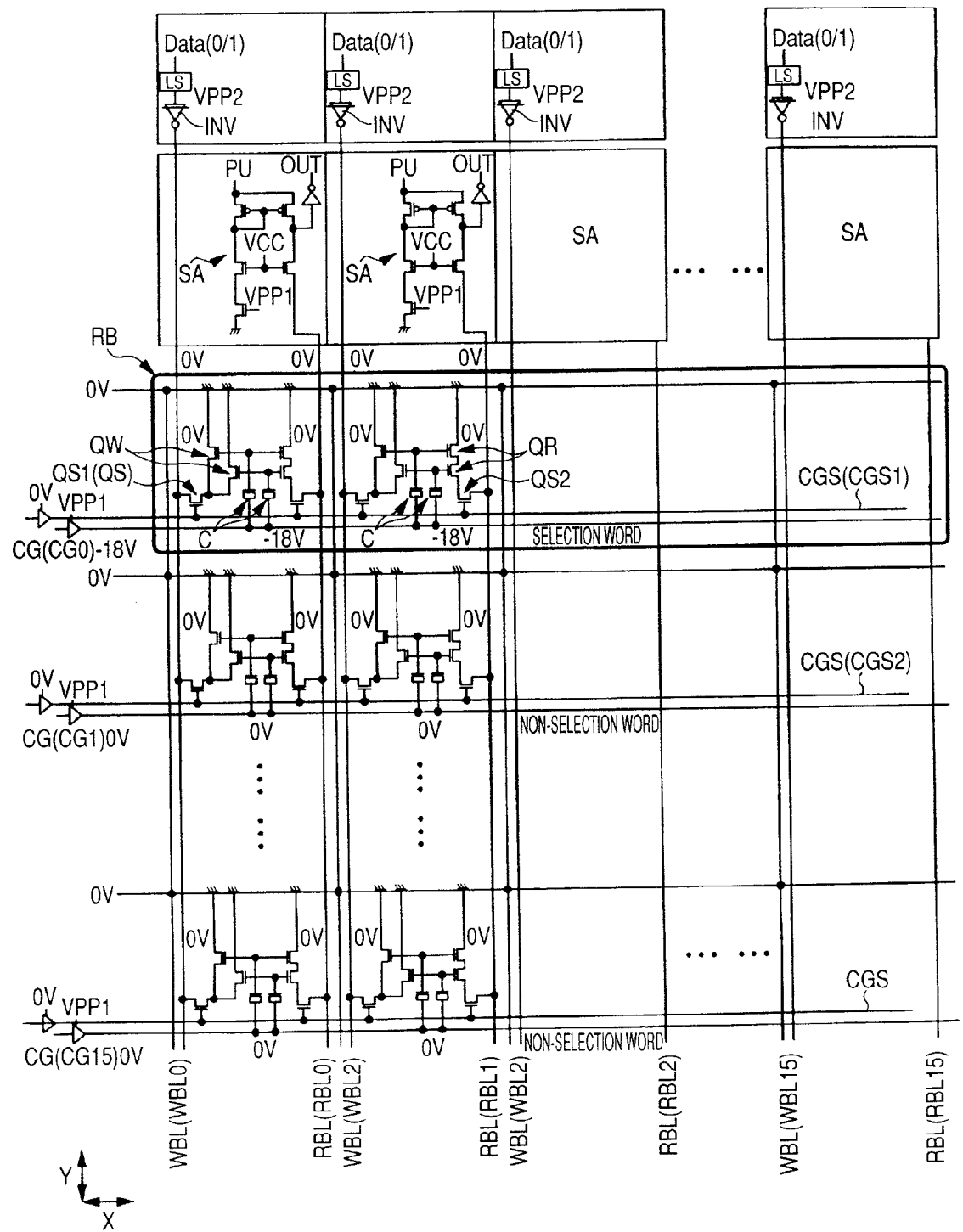
FIG. 28 is a circuit diagram at an erase operation of each memory cell to be selected of the nonvolatile memory shown in FIG. 26.
Figure 29:
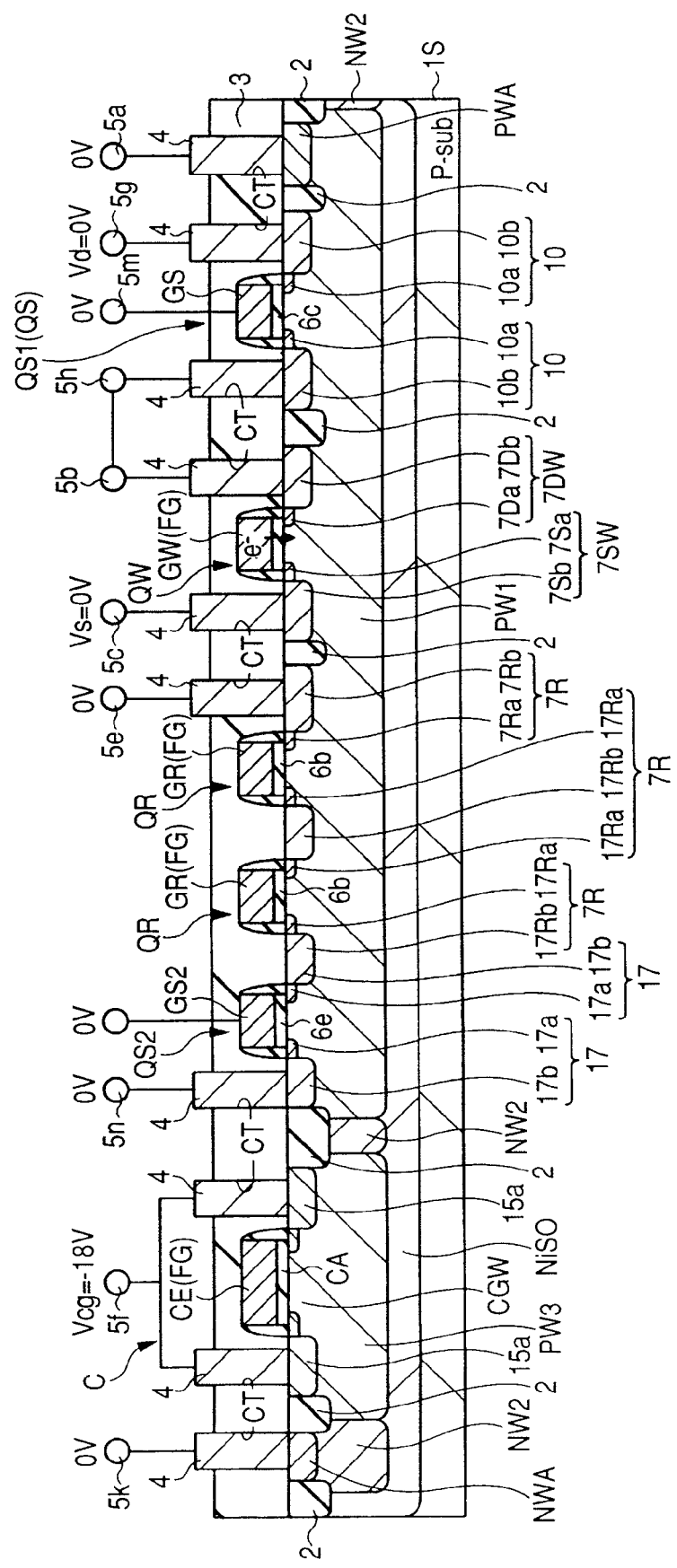
FIG. 29 is a fragmentary sectional view showing examples of voltages applied to respective portions at the erase operation of each selected memory cell of the nonvolatile memory shown in FIG. 26.

An erase operation of such a nonvolatile (EEPROM) will next be described with reference to FIGS. 28 and 29. FIGS. 28 and 29 respectively show a circuit diagram at the erase operation of each memory cell to be selected, of the nonvolatile memory (EEPROM) of the second embodiment, and a fragmentary sectional view showing examples of voltages applied to respective portions thereof. The erase operation is basically identical to one described in FIG. 18 except for the application of, for example, 0V from the corresponding control wiring CGS to the gate electrodes GS1 and GS2 of the selection MIS-FETs QS1 and QS2. At a memory cell (selected memory cell) intended for data erasure, for example, a negative voltage of −18V, for example, is applied from the control gate wiring CG to the p well PW3 forming the control gate electrode CGW as a control voltage Vcg. At this time, for example, 0V is applied to the corresponding electrodes 5a, 5c through 5e, 5g, 5k, 5m and 5n. Thus, the electrical charge (electrons (e⁻)) stored in the floating gate electrode FG is discharged from the gate electrode GW of each MIS-FET QW for writing data to the p well PW1 in accordance with an FN tunnel current system to thereby erase data.

In the second embodiment, the following advantageous effects can be obtained in addition to the effects obtained in the first embodiment. That is, since the rewriting or reprogramming of data can be performed as needed in the case of the EEPROM, the EEPROM can be reduced in module size as compared with the OTPROM which needs memory capacity by the number of rewritings. With the reduction in module size, the manufacturing cost of a module can be reduced.

Third Preferred Embodiment

A third embodiment will explain a case in which a nonvolatile memory is of the OTPROM and each control gate electrode is formed of a conductor pattern.

Figure 30:
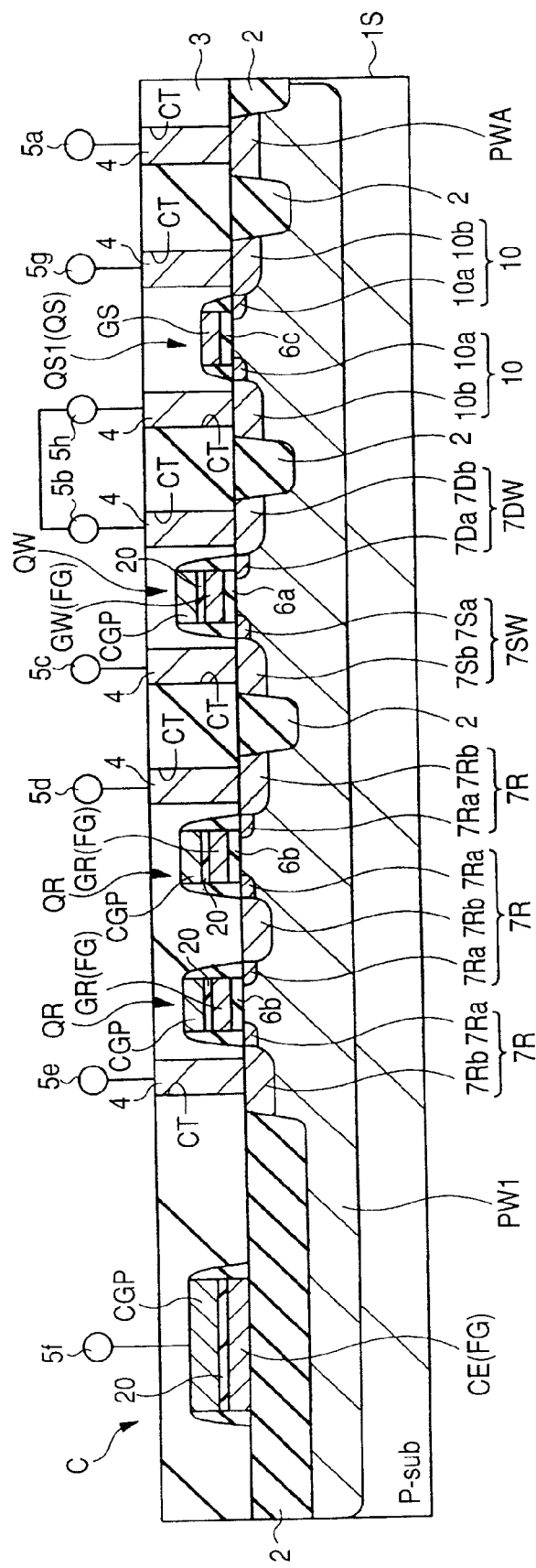
FIG. 30 is a fragmentary sectional view showing a memory cell of a nonvolatile memory of a semiconductor device according to a third embodiment of the present invention.

FIG. 30 shows a cross-sectional view illustrating a spot equivalent to line Y2-Y2 of FIG. 11, of the nonvolatile memory (OTPROM) of a semiconductor device according to the third embodiment. The nonvolatile memory (OTPROM) of the semiconductor device according to the third embodiment is identical in circuit configuration to that shown in FIGS. 8 and 9. A fragmentary plan configuration of the nonvolatile memory is also substantially identical to that shown in FIGS. 10 and 11. Different points reside in that control gate electrodes CGP of each memory cell MC are respectively formed in, for example, conductor patterns made up of low-resistance polycrystalline silicon or the like without being formed by the n well NW1, and the desired voltage applied to the well for each control gate is applied to each control gate electrode CGP upon data writing and reading.

The control gate electrodes CGP are formed over their corresponding floating gate electrodes FG (i.e., capacitance electrode CE, gate electrodes GR and GW) through an insulating layer 20 constituted of, for example, silicon oxide, silicon nitride or a laminated film of the silicon oxide and the silicon nitride being interposed therebetween. The control gate electrode CGP is electrically connected to its corresponding electrode 5f. A gate electrode GS of a selection MIS-FET QS for each MIS-FET QW for writing data is formed in the same layer as the control gate electrode CGP of each MIS-FET for writing data.

Owing to the formation of each control gate electrode CGP in the conductor pattern, the n well NW1 for the formation of the control gate electrode becomes unnecessary for a substrate 1S. Data write and read operations in this case are identical to those described in FIGS. 8 and 9 and the like of the first embodiment. Incidentally, explanations of elements for each main circuit formed in the substrate 1S will be omitted even in the case of the third embodiment because the MIS-FET QA shown in FIG. 13 can be illustrated by way of example.

Fourth Preferred Embodiment

A fourth embodiment will explain a case in which a nonvolatile memory is of the EEPROM and control gate electrodes are formed in conductor patterns.

Figure 31:
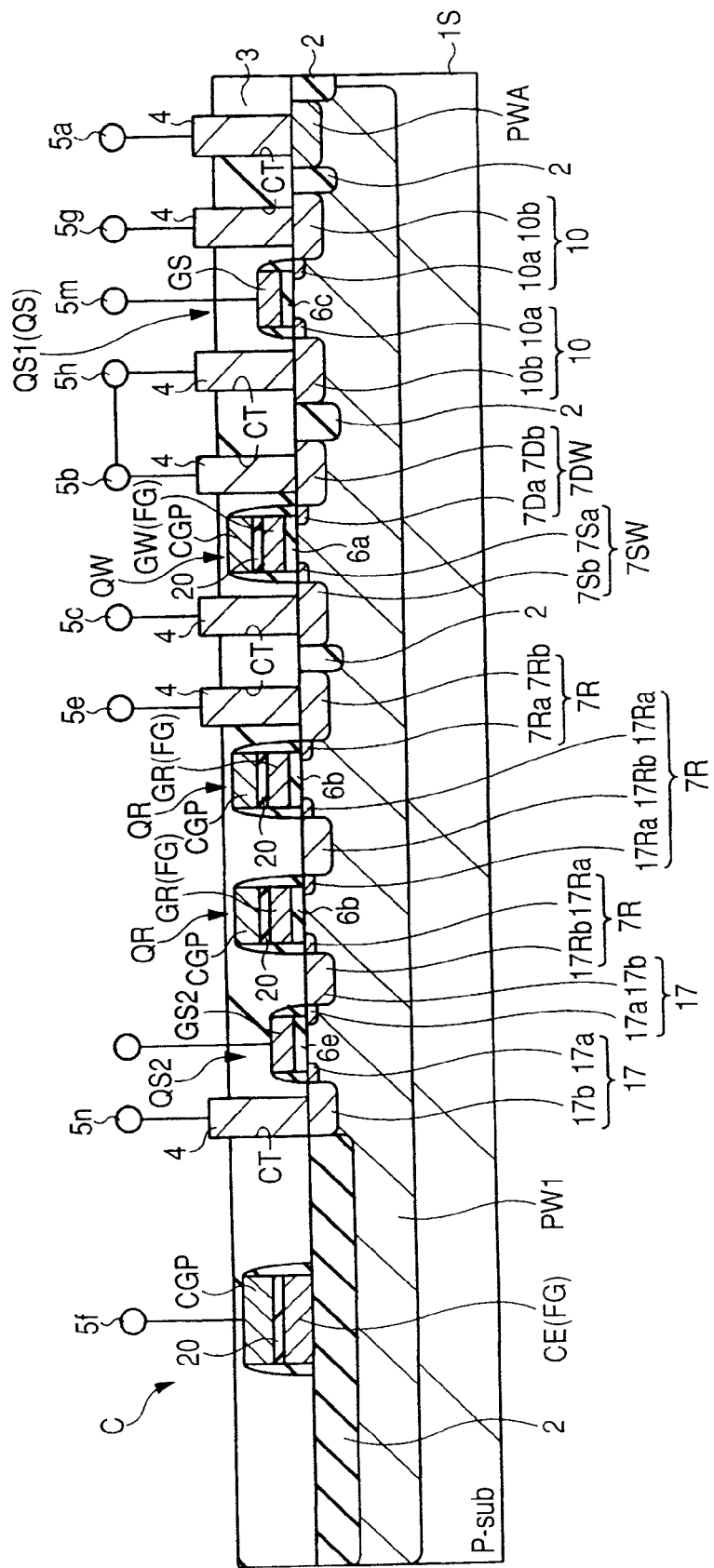
FIG. 31 is a fragmentary sectional view illustrating a memory cell of a nonvolatile memory of a semiconductor device according to a fourth embodiment of the present invention.

FIG. 31 shows a fragmentary sectional view of the nonvolatile memory (EEPROM) of a semiconductor device according to the fourth embodiment. The nonvolatile memory (EEPROM) of the semiconductor device according to the fourth embodiment is identical in circuit configuration to FIGS. 21, 26 and 28. The nonvolatile memory is also substantially identical to FIGS. 22 and 23 in fragmentary plan configuration. Different points reside in that each of control gate electrodes CGP of memory cells MCs is formed in a conductor pattern constituted of low-resistance polycrystalline silicon or the like, for example, without being formed by the p well PW3, and the desired voltage applied to the well for the control gate is applied to its corresponding control gate electrode CGP upon writing and reading of data. The control gate electrodes CGP are formed over their corresponding floating gate electrodes FG (i.e., capacitance electrode CE, gate electrodes GR and GW) through an insulating layer 20 interposed therebetween in a manner similar to the third embodiment.

The control gate electrode CGP is electrically connected to its corresponding electrode 5f. A gate electrode GS of a selection MIS-FET QS for each MIS-FET QW for writing data is formed in the same layer as the control gate electrode CGP of each MIS-FET for writing data.

Owing to the formation of each control gate electrode CGP in the conductor pattern, the n well NW3 and embedding area NiSO for the formation of the control gate electrode become unnecessary for a substrate 1S. Data read, write and erase operations in this case are identical to those described in FIG.

21 and FIGS. 24 through 29 and the like of the second embodiment. Incidentally, explanations of elements for each main circuit formed in the substrate 1S will be omitted even in the case of the fourth embodiment because the MIS-FET QA shown in FIG. 13 can be illustrated by way of example.

Fifth Preferred Embodiment

A fifth embodiment will explain a configuration in which one MIS-FET is shared for the MIS-FET for writing data and MIS-FET for reading data of each memory cell of the nonvolatile memory.

Although each of the first through fourth embodiments has explained the case in which the MIS-FETs QW for writing data (the MIS-FETs QW for writing data share the use of the MIS-FETs for erasing data in the case of the second and fourth embodiments) and the MIS-FETs QR for reading data are provided separately, either one of them is omitted, and the data write and read operations may all be set so as to be carried out by one MIS-FET.

Figure 32:
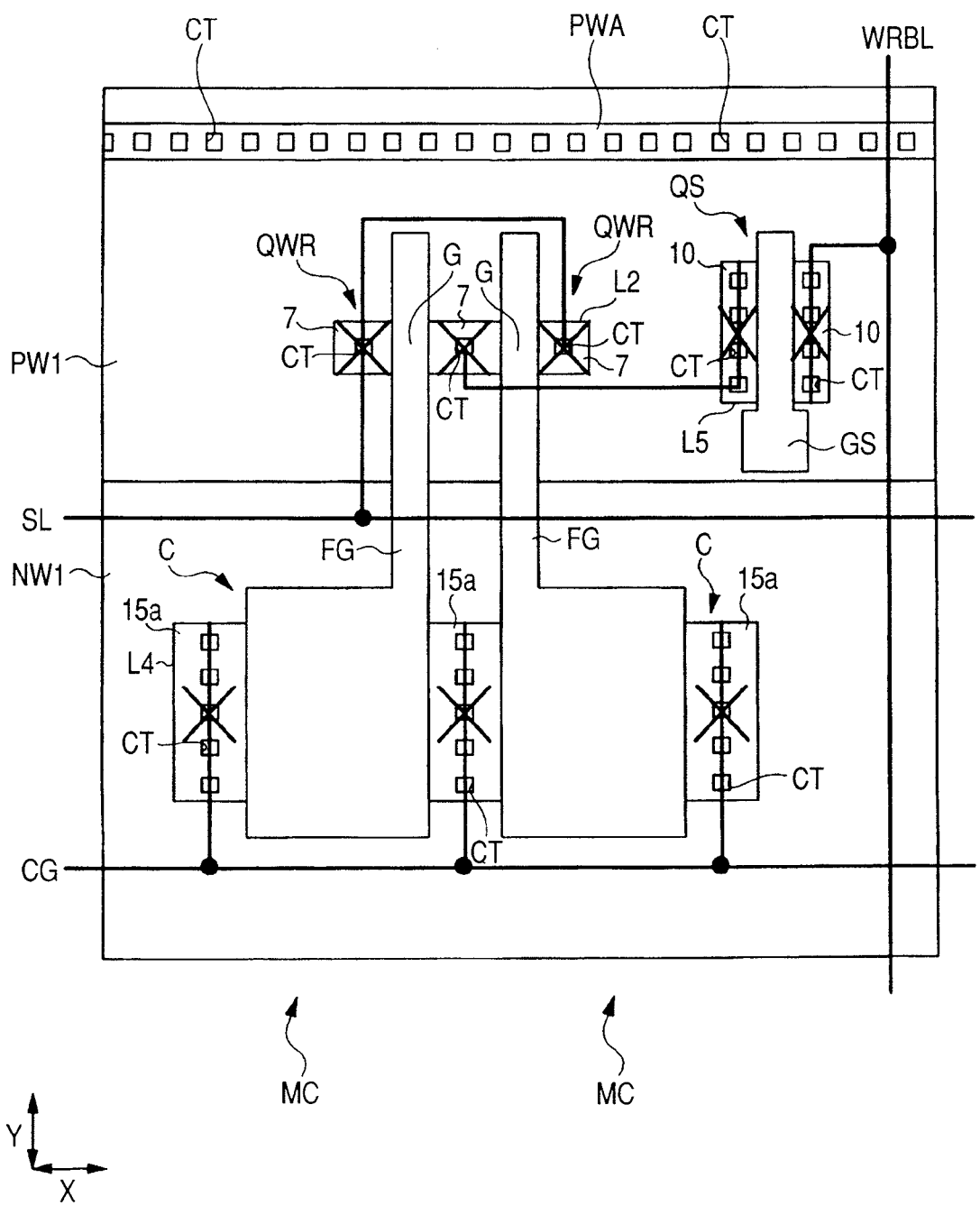
FIG. 32 is a fragmentary plan view showing memory cells of a nonvolatile memory of a semiconductor device according to a fifth embodiment of the present invention.

One example thereof is shown in FIG. 32. FIG. 32 shows a plan view illustrative of memory cells MCs corresponding to one bit of a nonvolatile memory (OTPROM). MIS-FETs QWR show MIS-FETs which share the use of both data write and read operations. A configuration of each MIS-FET QWR itself and the way (data write system, data read system and conditions for applied voltages, etc.) of performing its circuit operation are identical to those described in the first or third embodiment or the like. Incidentally, symbols G indicate gate electrodes of MIS-FETs QWR, and reference numerals 7 indicate n type semiconductor areas for the source and drain. Even in this case, a selection MIS-FET QS is disposed in a manner similar to one described in the first embodiment and the like. The selection MIS-FET QS is electrically connected to its corresponding MIS-FET QWR shared for writing and reading of data in a manner similar to one described in the first embodiment or the like. Symbol WRBL indicates a bit line shared for the data writing and reading. The bit line WRBL is electrically connected to a semiconductor area 10 of the selection MIS-FET QS through a metal wiring.

The EEPROM is also substantially identical to above. In this case, the configuration of a substrate 1S becomes identical to one described in the second or fourth embodiment or the like. Each MIS-FET QWR performs data erasure too in addition to the data writing and data reading. MIS-FETs QWR themselves of memory cells MCs of the EERPOM in this case are identical to ones described in the second and fourth embodiments or the like in configuration and the way (data write system, data read system and conditions for applied voltages, etc.) of performing their circuit operations. Even in this case, each selection MIS-FET QS is disposed in a manner similar to one described in the first embodiment or the like and electrically connected to its corresponding MIS-FET QWR shared for data writing and reading in a manner similar to one described in the first embodiment or the like. Since the MIS-FET for writing and reading data is used for sharing purpose here, there is no need to provide the selection MIS-FETs QS for both of the data reading and writing. One selection MIS-FET QS may be provided for one bit.

Sharing one MIS-FET for all operations for data writing and reading in this way makes it possible to reduce the area of each nonvolatile memory cell.

While the invention made above by the present inventors has been described specifically on the basis of the preferred embodiments, the present invention is not limited to the embodiments referred to above. It is needless to say that various changes can be made thereto within the scope not departing from the gist thereof.

Although, for example, the above embodiment has explained the case in which the two memory cells MCs constitute one bit for the nonvolatile memory, the present invention is not limited to it. For example, one bit may be constituted of one memory cell MC.

What is claimed is:

1. A semiconductor device comprising:
   a semiconductor substrate;
   a circuit forming area and a memory area disposed in the semiconductor substrate;
   a plurality of memory cells formed in the memory area;
   a first well and a second well formed in the memory area;
   a first conductor film formed over the first well and the second well and extending in a first direction;
   a second conductor film formed over the first well;
   first semiconductor regions formed in the first region; and
   a second semiconductor region formed in the second region;
   wherein each of the memory cells includes a capacitance element, an element for reading data and a selection field effect transistor of the element for reading data,
   wherein the capacitance element includes the first conductor film and the second semiconductor region,
   wherein the element for reading data includes the first conductor film and the first semiconductor regions,
   wherein the selection field effect transistor of the element for reading data includes the second conductor film and the first regions,
   wherein, in a second direction perpendicular to the first direction, a length of the first conductor film of the capacitance element is larger than a length of the first conductor film of the element for reading data,
   wherein a word line of the memory cell is electrically connected to the second semiconductor region of the capacitance element, and
   wherein, during a reading data operation, a first bit line of the memory cell is electrically connected to the first semiconductor region of the element for reading data via to the selection field effect transistor.

2. A semiconductor device according to the claim 1,
   wherein each of the memory cells is a nonvolatile memory cell capable of electrically writing and erasing data,
   wherein each of the memory cells further includes an element for writing data,
   wherein the element for writing data includes the first conductor film and a third semiconductor region formed in the first well,
   wherein, during a writing data operation, a second bit line of the memory cell is electrically connected to the third semiconductor region of the element for writing data.

3. A semiconductor device according to the claim 2,
   wherein a writing data operation is performed by injecting electrons into the first conductor film.

4. A semiconductor device according to the claim 2,
   wherein an erasing data operation is performed by emitting electrons to the first well.

5. A semiconductor device according to the claim 1,
   wherein a third well, deeper than the first and second wells, is formed in the semiconductor substrate,
   wherein the first and second wells are formed in the third well and are separated from each other.

6. A semiconductor device according to the claim 5,
   wherein the first and second well are formed of a first conductivity type, and wherein the third well is formed of a second conductivity type opposite to the first conductivity type.

7. A semiconductor device according to the claim 1, wherein the first and second well are formed of the same conductivity type.

8. A semiconductor device comprising:

a semiconductor substrate;

a circuit forming area and a memory area disposed in the semiconductor substrate;

a plurality of memory cells formed in the memory area;

a first well and a second well formed in the memory area;

a first conductor film formed over the first well and the second well and extending in a first direction;

a second conductor film formed over the first well;

first semiconductor regions formed in the first region; and a second semiconductor region formed in the second region;

wherein each of the memory cells includes a capacitance element, an element for reading data and a selection field effect transistor of the element for reading data, wherein the capacitance element includes the first conductor film and the second semiconductor region, wherein the element for reading data includes the first conductor film and the first semiconductor regions, wherein the selection field effect transistor of the element for reading data includes the second conductor film and the first regions, wherein, in a second direction perpendicular to the first direction, a length of the first conductor film of the capacitance element is larger than a length of the first conductor film of the element for reading data, wherein a word line of the memory cell is electrically connected to the second semiconductor region of the capacitance element, wherein, during a reading data operation, a first bit line of the memory cell is electrically connected to the first semiconductor region of the element for reading data via to the selection field effect transistor, wherein the memory cells which adjoin each other in the second direction are electrically connected by the word line, and wherein the memory cells which adjoin each other in the first direction are electrically connected by the first bit line.

9. A semiconductor device according to the claim 8, wherein each of the memory cells is nonvolatile memory cell capable of electrically writing and erasing data, wherein each of the memory cells further includes an element for writing data, wherein the element for writing data has the first conductor film and a third semiconductor region formed in the first well, wherein, during a writing data operation, a second bit line of the memory cell is electrically connected to the third semiconductor region of the element for writing data.

10. A semiconductor device according to the claim 9, wherein a writing data operation is performed by injecting electrons into the first conductor film.

11. A semiconductor device according to the claim 9, wherein an erasing data operation is performed by emitting electrons to the first well.

12. A semiconductor device according to the claim 8, wherein a third well, deeper than the first and second wells, is formed in the semiconductor substrate, wherein the first and second wells are formed in the third well and are separated from each other.

13. A semiconductor device according to the claim 12, wherein the first and second well are formed of a first conductivity type, and wherein the third well is formed of a second conductivity type opposite to the first conductivity type.

14. A semiconductor device according to the claim 8, wherein the first and second well are formed of the same conductivity type.

* * * * *